United States Patent
Kim et al.

(10) Patent No.: US 11,827,793 B2
(45) Date of Patent: Nov. 28, 2023

(54) CORE-SHELL COMPOUND, PHOTOSENSITIVE RESIN COMPOSITION INCLUDING THE SAME, PHOTOSENSITIVE RESIN LAYER, COLOR FILTER AND CMOS IMAGE SENSOR

(71) Applicant: SAMSUNG SDI CO., LTD., Yongin-si (KR)

(72) Inventors: Sundae Kim, Suwon-si (KR); Yeji Yang, Suwon-si (KR); Young Lee, Suwon-si (KR); Chaehyuk Ko, Suwon-si (KR); Ieju Kim, Suwon-si (KR); Arum Yu, Suwon-si (KR); Myungho Cho, Suwon-si (KR); Xinhui Feng, Suwon-si (KR)

(73) Assignee: SAMSUNG SDI CO., LTD., Yongin-si (KR)

( * ) Notice: Subject to any disclaimer, the term of this patent is extended or adjusted under 35 U.S.C. 154(b) by 0 days.

(21) Appl. No.: 17/557,718

(22) Filed: Dec. 21, 2021

(65) Prior Publication Data

US 2022/0204775 A1    Jun. 30, 2022

(30) Foreign Application Priority Data

Dec. 29, 2020 (KR) ........................ 10-2020-0186683

(51) Int. Cl.
| | |
|---|---|
| C09B 57/00 | (2006.01) |
| H01L 27/146 | (2006.01) |
| G02B 5/22 | (2006.01) |
| C09B 67/08 | (2006.01) |
| C08L 33/08 | (2006.01) |
| C08L 33/10 | (2006.01) |
| G02B 1/04 | (2006.01) |

(52) U.S. Cl.
CPC ............ *C09B 57/007* (2013.01); *C08L 33/08* (2013.01); *C08L 33/10* (2013.01); *C09B 67/0008* (2013.01); *G02B 1/04* (2013.01); *G02B 5/223* (2013.01); *H01L 27/14621* (2013.01); *H01L 27/14645* (2013.01); *C08L 2207/53* (2013.01)

(58) Field of Classification Search
CPC .... C09B 57/007; C08L 33/08; C08L 2666/70; C08L 33/10; C08F 265/06; C08F 222/1045; C08F 222/1006; C09D 4/06; G02B 1/04; C08K 5/0041
See application file for complete search history.

(56) References Cited

U.S. PATENT DOCUMENTS

| | | | | |
|---|---|---|---|---|
| 2014/0349220 A1* | 11/2014 | Moon | .................... | G03F 7/0007 430/7 |
| 2019/0256713 A1* | 8/2019 | Jeong | ........................ | G02B 5/22 |
| 2020/0142301 A1* | 5/2020 | Kwon | ................. | C09B 67/0034 |

FOREIGN PATENT DOCUMENTS

| | | | | |
|---|---|---|---|---|
| JP | 2016-117858 A | 6/2016 | | |
| JP | 2019-532918 A | 11/2019 | | |
| JP | 2020-076995 A | 5/2020 | | |
| JP | 2020-184073 A | 11/2020 | | |
| KR | 10-2014-0072682 A | 6/2014 | | |
| KR | 20140072682 A * | 6/2014 | | |
| KR | 10-1413072 B1 | 7/2014 | | |
| KR | 10-1531616 B1 | 6/2015 | | |
| KR | 10-2018-0019978 A | 2/2018 | | |
| KR | 10-2018-0024290 A | 3/2018 | | |
| KR | 10-2019-0054408 A | 5/2019 | | |
| TW | 201341955 A | 10/2013 | | |
| WO | WO 2008/094637 A2 | 8/2008 | | |
| WO | WO-2018043829 A1 * | 3/2018 | ........... | C07C 211/64 |
| WO | WO 2018043829 A1 | 3/2018 | | |

OTHER PUBLICATIONS

Taiwanese Search Report dated Aug. 31, 2022.

\* cited by examiner

*Primary Examiner* — Mark S Kaucher
(74) *Attorney, Agent, or Firm* — Lee IP Law, P.C.

(57) ABSTRACT

A core-shell compound, a photosensitive resin composition including the same, a photosensitive resin layer manufactured using the photosensitive resin composition, a color filter including the photosensitive resin layer, and a CMOS image sensor including the color filter, the core-shell compound including a squarylium core including three or more (meth)acrylate groups and a shell surrounding the squarylium core.

20 Claims, No Drawings

CORE-SHELL COMPOUND, PHOTOSENSITIVE RESIN COMPOSITION INCLUDING THE SAME, PHOTOSENSITIVE RESIN LAYER, COLOR FILTER AND CMOS IMAGE SENSOR

CROSS-REFERENCE TO RELATED APPLICATION

This application claims priority to and the benefit of Korean Patent Application No. 10-2020-0186683 filed in the Korean Intellectual Property Office on Dec. 29, 2020, the entire contents of which are incorporated herein by reference.

BACKGROUND

1. Field

Embodiments relate to a core-shell compound, a photosensitive resin composition including the same, a photosensitive resin layer manufactured using the photosensitive resin composition, a color filter including the photosensitive resin layer, and a CMOS image sensor including the color filter.

2. Description of the Related Art

With the recent rapid development of advanced information and communication processing technology and overall electronics industry, a next generation detector may rapidly transmit and receive a large amount of information for a new concept device and system are required. With the rise of video processing and the like in mobile devices, technology development of an ultra-down-sized and ultra-power-saving image sensor is rapidly accelerated, centering on existing CCD (Charge Coupled Device) and CMOS (Complementary Metal Oxide Semiconductor).

An image sensor, e.g., a semiconductor that converts photons into electrons and displays them on a display or stores them in a storage device, may include a light receiving element that converts light signals into electrical signals, a pixel circuit portion that amplifies and compresses the converted electrical signals, and an ASIC portion that converts these pre-treated analog signals into digital signals to treat image signals and may include, e.g., CCD, CMOS, CIS (Contact Image Sensor), or the like.

SUMMARY

The embodiments may be realized by providing a core-shell compound including a squarylium core including three or more (meth)acrylate groups; and a shell surrounding the squarylium core.

The embodiments may be realized by providing a photosensitive resin composition comprising the core-shell compound according to an embodiment.

The embodiments may be realized by providing a photosensitive resin layer manufactured by using the photosensitive resin composition according to an embodiment.

The embodiments may be realized by providing a color filter comprising the photosensitive resin layer according to an embodiment.

The embodiments may be realized by providing a CMOS image sensor comprising the color filter according to an embodiment.

DETAILED DESCRIPTION

Example embodiments will now be described more fully hereinafter; however, they may be embodied in different forms and should not be construed as limited to the embodiments set forth herein. Rather, these embodiments are provided so that this disclosure will be thorough and complete, and will fully convey exemplary implementations to those skilled in the art.

As used herein, when specific definition is not otherwise provided, "substituted" refers to one substituted with a substituent selected from a halogen (F, Br, Cl, or I), a hydroxy group, a nitro group, a cyano group, an amino group ($NH_2$, $NH(R^{200})$, or $N(R^{201})(R^{202})$, wherein $R^{200}$, $R^{201}$, and $R^{202}$ are the same or different, and are each independently a C1 to C10 alkyl group), an amidino group, a hydrazine group, a hydrazone group, a carboxyl group, a substituted or unsubstituted alkyl group, a substituted or unsubstituted alkenyl group, a substituted or unsubstituted alkynyl group, a substituted or unsubstituted alicyclic organic group, a substituted or unsubstituted aryl group, or a substituted or unsubstituted heterocyclic group.

As used herein, when specific definition is not otherwise provided, "alkyl group" refers to a C1 to C20 alkyl group, and specifically a C1 to C15 alkyl group, "cycloalkyl group" refers to a C3 to C20 cycloalkyl group, and specifically a C3 to C18 cycloalkyl group, "alkoxy group" refers to a C1 to C20 alkoxy group, and specifically a C1 to C18 alkoxy group, "aryl group" refers to a C6 to C20 aryl group, and specifically a C6 to C18 aryl group, "alkenyl group" refers to a C2 to C20 alkenyl group, and specifically a C2 to C18 alkenyl group, "alkylene group" refers to a C1 to C20 alkylene group, and specifically C1 to C18 alkylene group, and "arylene group" refers to a C6 to C20 arylene group, and specifically a C6 to C16 arylene group. As used herein, the term "or" is not an exclusive term, e.g., "A or B" would include A, B, or A and B.

As used herein, when specific definition is not otherwise provided, "(meth)acrylate group" refers to "an acrylate group" and "a methacrylate group" and "(meth)acrylic acid" refers to "acrylic acid" and "methacrylic acid."

As used herein, when specific definition is not otherwise provided, "combination" refers to mixing or copolymerization. In addition, "copolymerization" refers to block copolymerization or random copolymerization, and "copolymer" refers to block copolymerization or random copolymerization.

In the chemical formula of the present specification, unless a specific definition is otherwise provided, hydrogen is bonded at the position when a chemical bond is not drawn where supposed to be given.

In the present specification, when specific definition is not otherwise provided, "*" indicates a point where the same or different atom or chemical formula is linked.

An embodiment provides a core-shell compound including a squarylium (e.g., squarylium-based or squarylium-containing) core including three or more, e.g., four or more (meth)acrylate groups, and a shell surrounding the squarylium core.

A color filter formed of a pigment-type photosensitive resin composition could have a color mixing problem due to particle sizes of the pigment and a limit to film-thinning. In addition, a color imaging device for an image sensor may use a smaller dispersed particle size to form a fine pattern. Accordingly, efforts to improve resolution by introducing a non-particle dye instead of the pigment to prepare a photosensitive resin composition suitable for the dye have been considered.

Embodiments relate to a green dye used in a color filter for a CMOS image sensor. As pixels have a smaller size, there may be a limit to manufacture a fine pattern by using a pigment, and accordingly, a dye may be used in order to compensate for this. A dye may have a problem in terms of processability during the pattern manufacturing and particularly, could exhibit much deteriorated chemical resistance, and it could be difficult to form a fine pattern after the curing and thermal process.

In addition, when the dye as a colorant is included in a small amount, based on a total amount of the composition, the chemical resistance of the dye itself could be a little insufficient. According to an embodiment, a dye may have excellent chemical resistance itself, and a photosensitive resin composition for a CMOS image sensor that includes the dye may include the dye in an amount of, e.g., about 15 wt % to about 30 wt %, e.g., about 16 wt % to about 27 wt %, based on the total amount of the photosensitive resin composition.

According to an embodiment, a core-shell compound may include three or more, e.g., four or more, (meth)acrylate groups (manufactured under specific controls) in or on a squarylium compound (forming a core) and surround the core with a shell. The core-shell compound itself may exhibit excellent chemical resistance, and a photosensitive resin composition including an excess of this compound as a green dye may exhibit no significant deterioration of the chemical resistance, even after the curing and thermal process, and thus is very suitable for a color filter, e.g., a green color filter, for the CMOS image sensor.

The (meth)acrylate group may be represented by Chemical Formula S.

[Chemical Formula S]

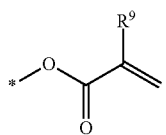

In Chemical Formula S, $R^9$ may be, e.g., a hydrogen atom or a substituted or unsubstituted C1 to C10 alkyl group (e.g., a methyl group).

In an implementation, all of the three or more (meth)acrylate groups may be present (e.g., on the squarylium core) as a substituent of an alkyl group of the squarylium core or may be present as a substituent of an alkoxy group of the squarylium core.

In an implementation, at least one of the three or more (meth)acrylate groups may be present as a substituent of an aryl group of the squarylium core, and at least one other one of the three or more (meth)acrylate groups may be present as a substituent of an alkyl group or an alkoxy group of the squarylium core.

When the three or more, e.g., four or more (meth)acrylate groups are controlled under the position conditions as described above, durability of the core-shell dye itself according to an embodiment may be further improved.

In an implementation, the squarylium core may be represented by Chemical Formula 1.

[Chemical Formula 1]

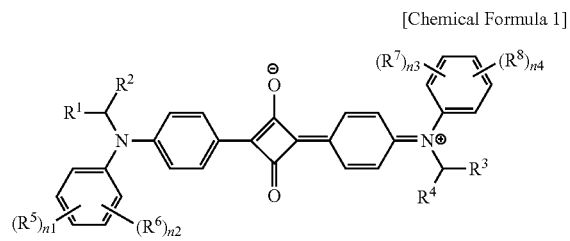

In Chemical Formula 1, $R^1$ to $R^8$ may each independently be or include, e.g., a hydrogen atom, a (meth)acrylate group, a substituted or unsubstituted C1 to C20 alkyl group, or a substituted or unsubstituted C1 to C20 alkoxy group. In an implementation, $R^1$ to $R^8$ may not simultaneously be a hydrogen atom. In an implementation, $R^5$ to $R^8$ may each independently be or include, e.g., a hydrogen atom, a (meth)acrylate group, a substituted or unsubstituted C1 to C20 alkyl group, or a substituted or unsubstituted C to C20 alkoxy group.

In an implementation, at least one of $R^1$, $R^2$, $R^5$, and $R^6$ may include (e.g., may be or may include) a (meth)acrylate group (e.g., at a terminal end thereof or at a pendent position). In an implementation, at least one of $R^1$, $R^2$, $R^5$, and $R^6$ may include a (meth)acrylate group as a substituent of a substituted C1 to C20 alkyl group or as a substituent of a substituted C1 to C20 alkoxy group.

In an implementation, at least two of $R^3$, $R^4$, $R^7$, and $R^8$ may include, e.g., a (meth)acrylate group at a terminal end thereof.

n1, n2, n3, and n4 may each independently be, e.g., an integer of 0 to 2. In an implementation, n1+n2≠0 and n3+n4≠0.

In an implementation, in Chemical Formula 1, any two of $R^1$, $R^2$, $R^5$, and $R^6$ and any two of $R^3$, $R^4$, $R^7$, and $R^8$ may each independently include a (meth)acrylate group at terminal ends thereof. In an implementation, Chemical Formula 1 may be represented by, e.g., Chemical Formula 1-1 or Chemical Formula 1-2.

[Chemical Formula 1-1]

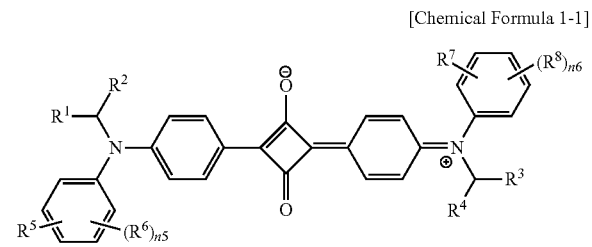

In Chemical Formula 1-1, $R^2$, $R^4$, $R^6$, and $R^8$ may each independently be or include, e.g., a hydrogen atom, a substituted or unsubstituted C1 to C20 alkyl group or a substituted or unsubstituted C1 to C20 alkoxy group. In an implementation, R' to $R^4$, $R^6$, and $R^8$ may not simultaneously all be hydrogen atoms.

In an implementation, all of $R^2$, $R^4$, $R^6$, and $R^8$ may not contain or include a (meth)acrylate group.

In an implementation, $R^1$, $R^3$, $R^5$, and $R^7$ may each independently be, e.g., a (substituted) C1 to C20 alkyl group including or substituted with a (meth)acrylate group at a terminal end or a (substituted) C1 to C20 alkoxy group including or substituted with a (meth)acrylate group at a terminal end.

In an implementation, n5 and n6 may each independently be, e.g., an integer of 0 to 2.

[Chemical Formula 1-2]

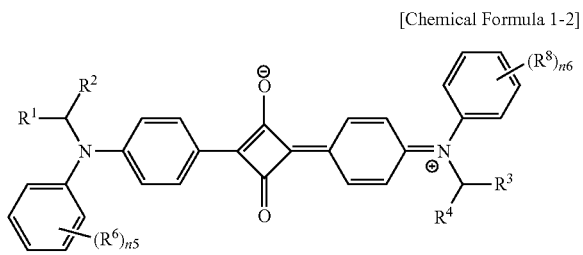

In Chemical Formula 1-2, $R^6$ and $R^8$ may each independently be or include, e.g., a hydrogen atom, a substituted or unsubstituted C1 to C20 alkyl group, or a substituted or unsubstituted C1 to C20 alkoxy group. In an implementation, $R^6$ and $R^8$ may not both simultaneously be hydrogen atoms. In an implementation, both of $R^6$ and $R^8$ may not contain or include a (meth)acrylate group.

In an implementation, $R^1$ to $R^4$ may each independently be, e.g., a C1 to C20 alkyl group including a (meth)acrylate group at a terminal end or a C1 to C20 alkoxy group including a (meth)acrylate group at a terminal end.

In an implementation, n5 and n6 may each independently be, e.g., an integer of 0 to 2.

In an implementation, in Chemical Formula 1, any three of $R^1$, $R^2$, $R^5$, and $R^6$ and any three of $R^3$, $R^4$, $R^7$, and $R^8$ may each independently include a (meth)acrylate group at terminal ends thereof. In an implementation, Chemical Formula 1 may be represented by, e.g., Chemical Formula 1-3.

[Chemical Formula 1-3]

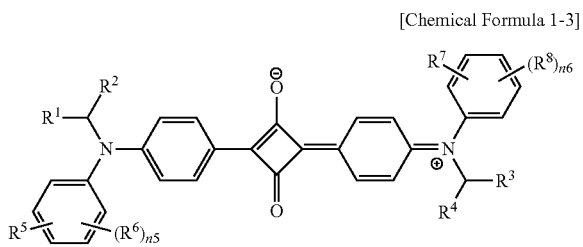

In Chemical Formula 1-3, $R^6$ and $R^8$ may each independently be or include, e.g., a hydrogen atom, a substituted or unsubstituted C1 to C20 alkyl group, or a substituted or unsubstituted C1 to C20 alkoxy group. In an implementation, $R^6$ and $R^8$ may not both simultaneously be hydrogen atoms. In an implementation, $R^6$ and $R^8$ may not contain a siloxane group.

In an implementation, $R^1$ to $R^5$ and $R^7$ may each independently be, e.g., a C1 to C20 alkyl group including a (meth)acrylate group at a terminal end or a C1 to C20 alkoxy group including a (meth)acrylate group at a terminal end.

In an implementation n5 and n6 may each independently be, e.g., an integer of 0 to 2.

In an implementation, the core represented by Chemical Formula 1 may include three or more, e.g., three, four, five, or six (meth)acrylate groups. In an implementation, the core represented by Chemical Formula 1 may include 4 or 6 (meth)acrylate groups. The core represented by Chemical Formula 1 including three or five (meth)acrylate groups may have excellent durability, when compared with a structure having two or fewer (meth)acrylate groups, but may be difficult to synthesize due to its structure (low yield), if the actual synthesis is successful, and it may be undesirable in terms of economic efficiency due to high cost when applied to an actual line.

In an implementation, the more (meth)acrylate groups the core represented by Chemical Formula 1 includes, more excellent chemical resistance may be obtained. In an implementation, when the chemical resistance of the compound alone is considered, four (meth)acrylate groups rather than three (meth)acrylate groups, five (meth)acrylate groups rather than the four (meth)acrylate groups, and six (meth) acrylate groups rather than the five (meth)acrylate groups, may be included in the core represented by Chemical Formula 1.

In a core represented by Chemical Formula 1, when only one or two (meth)acrylate groups are included, chemical resistance may be greatly deteriorated, and in addition, when only one (meth)acrylate group is included, the compound may be difficult to synthesize as described above. In an implementation, three or more (meth)acrylate groups may be included in the core represented by Chemical Formula 1.

In an implementation, the core represented by Chemical Formula 1 may include four or more (meth)acrylate groups, e.g., four or six (meth)acrylate groups, with a view toward chemical resistance and ease of synthesis of the compound.

In an implementation, the core represented by Chemical Formula 1 may have a maximum absorption wavelength (e.g., wavelength of peak absorption) at, e.g., about 610 nm to about 640 nm. If a dye compound having excellent solubility of greater than or equal to about 10% in an organic solvent fails to exhibit a maximum absorption wavelength at about 610 nm to about 640 nm, it may not be appropriately applied to a green photosensitive resin composition for a CMOS image sensor due to low transmittance.

In an implementation, the shell may be represented by Chemical Formula 2.

[Chemical Formula 2]

In Chemical Formula 2, $L^a$ and $L^b$ may each independently be or include, e.g., a single bond or a substituted or unsubstituted C1 to C10 alkylene group.

n may be, e.g., an integer greater than or equal to 2.

In an implementation, the shell represented by Chemical Formula 2 may be represented by, e.g., Chemical Formula 2-1.

[Chemical Formula 2-1]

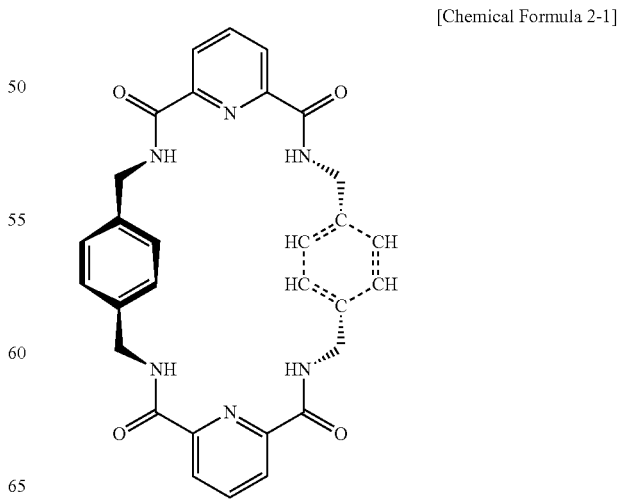

In an implementation, the core-shell compound may be represented by, e.g., one of Chemical Formula A to Chemical Formula N.
[Chemical Formula A]
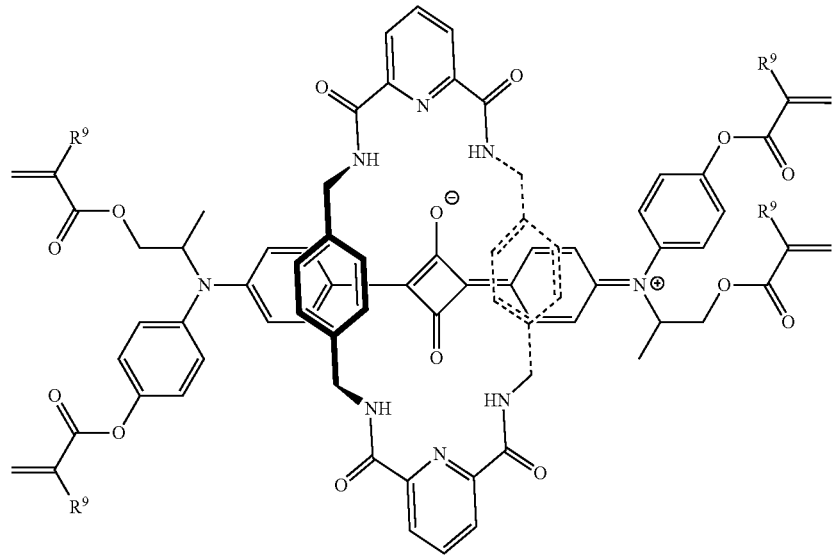
[Chemical Formula B]
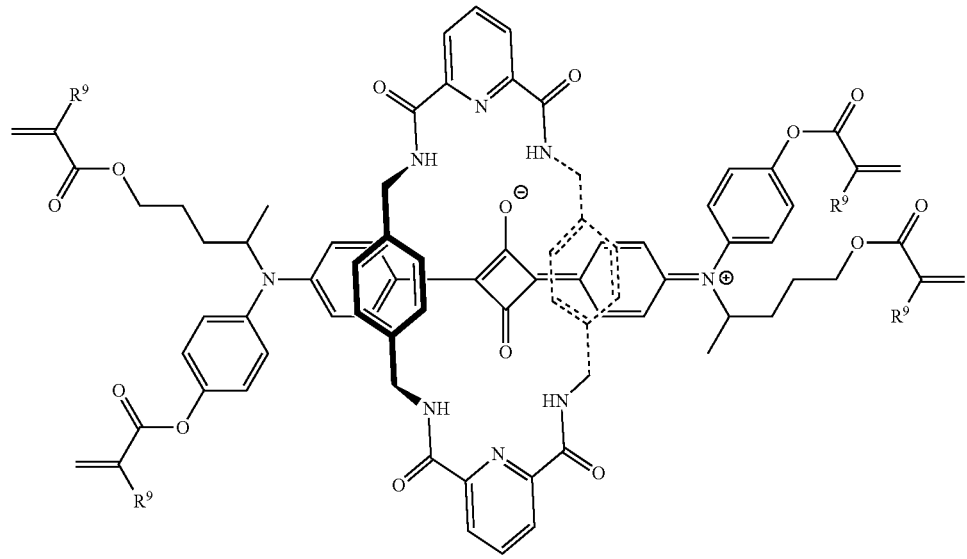

[Chemical Formula C]
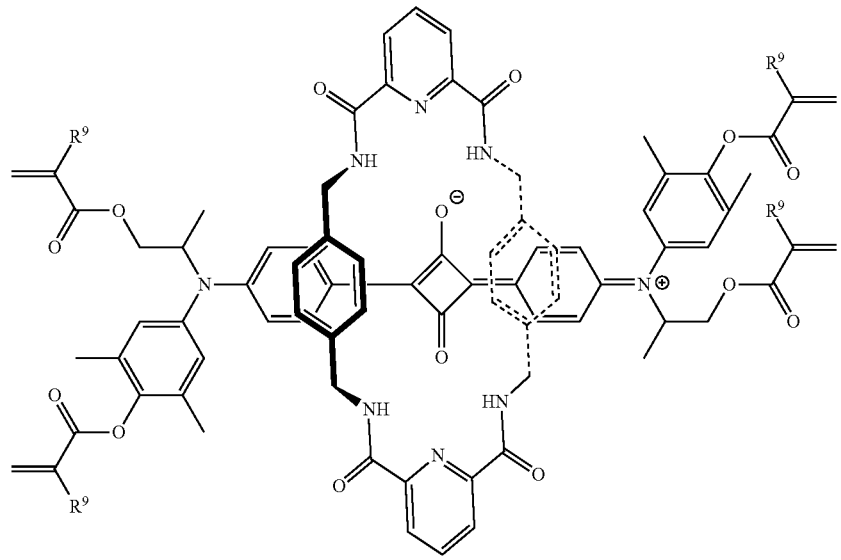
[Chemical Formula D]
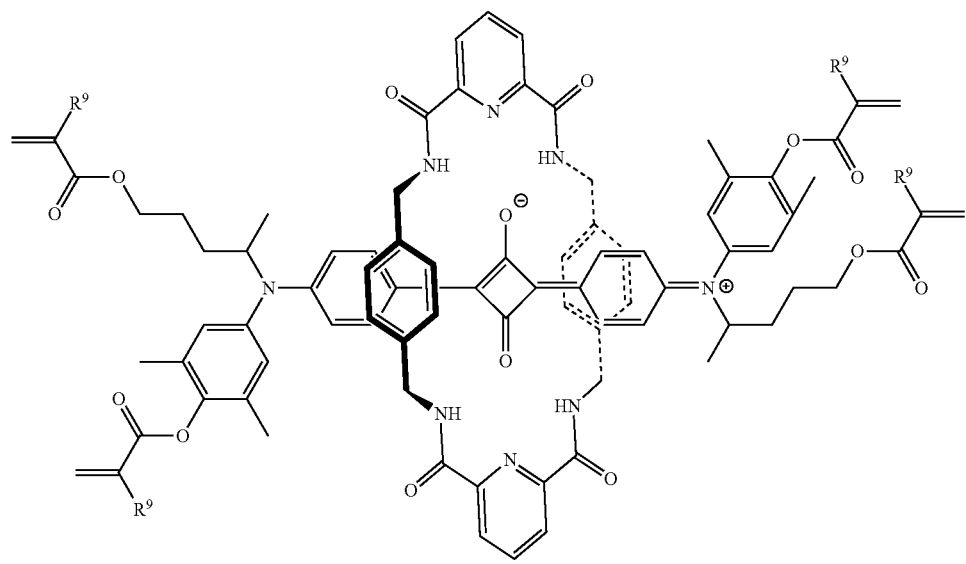

-continued
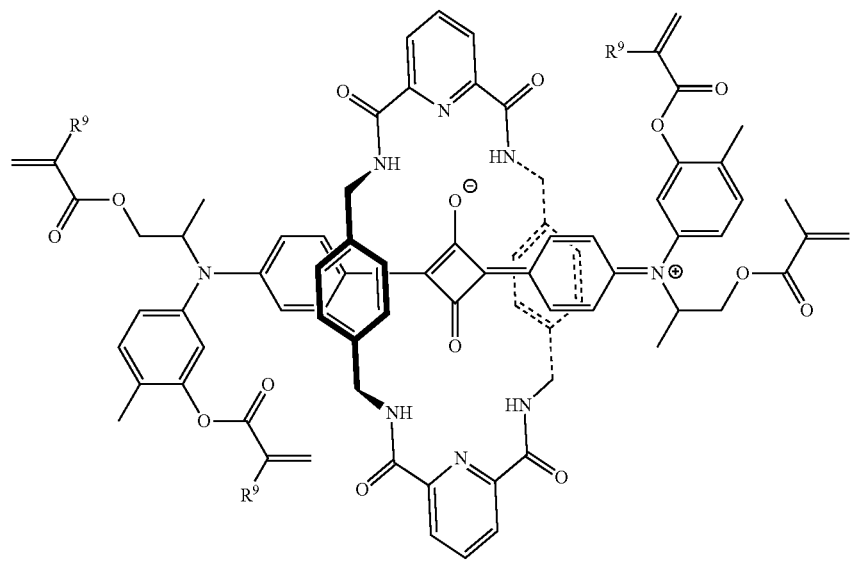
[Chemical Formula E]
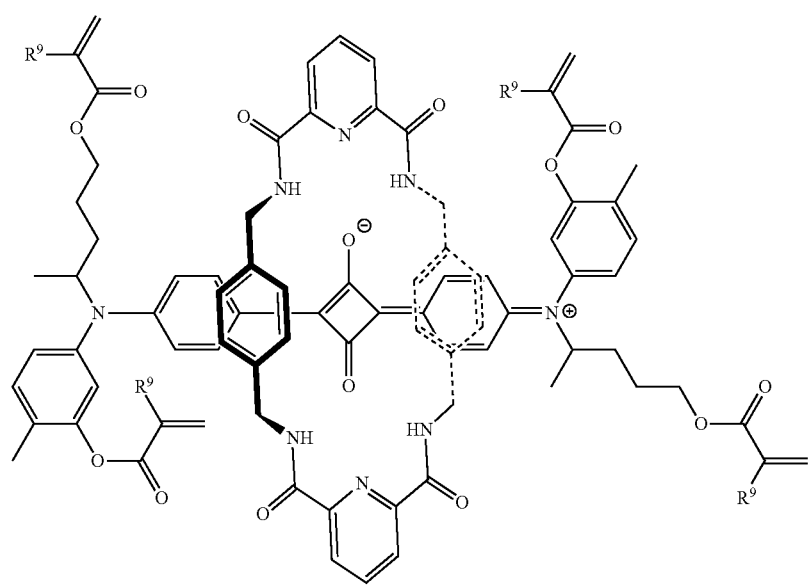
[Chemical Formula F]

-continued
[Chemical Formula G]
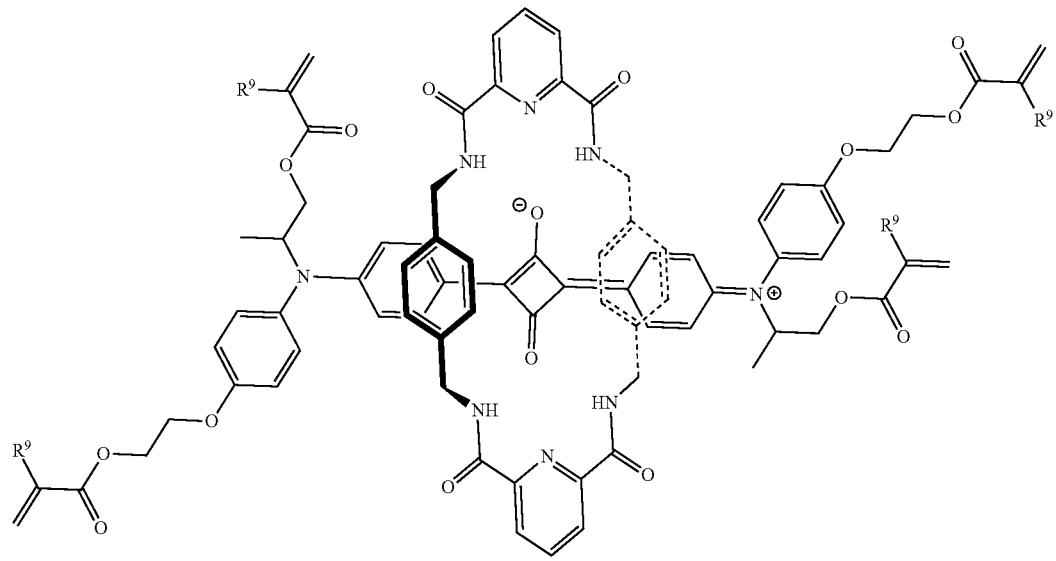
[Chemical Formula H]
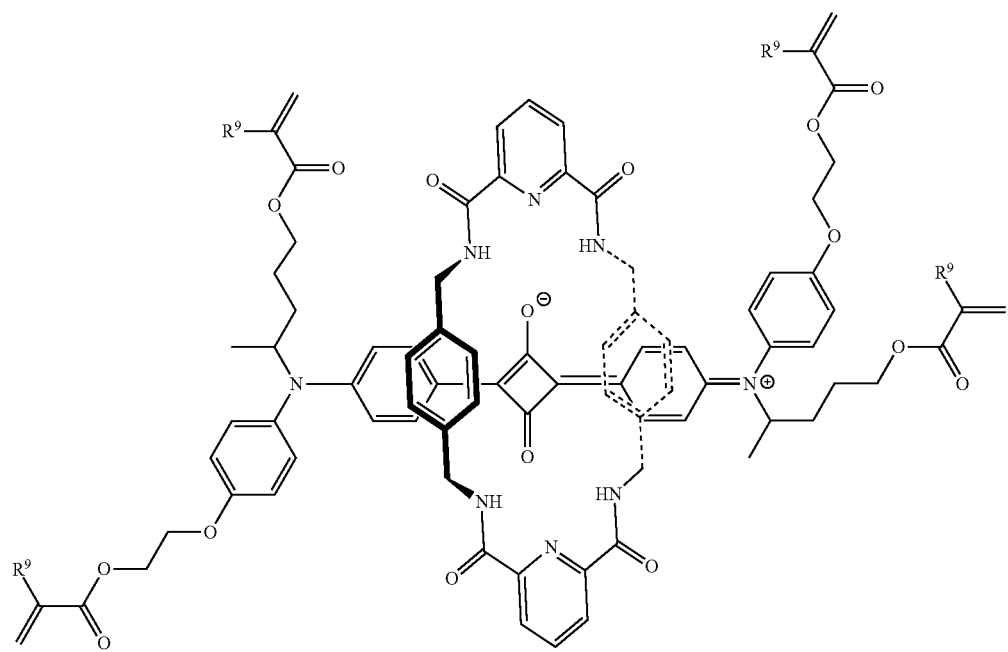

[Chemical Formula I]
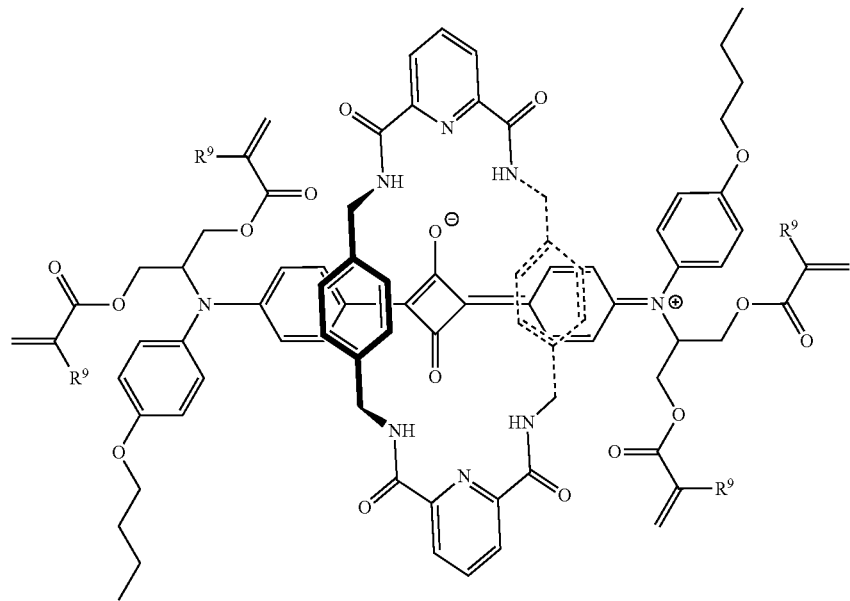
[Chemical Formula J]
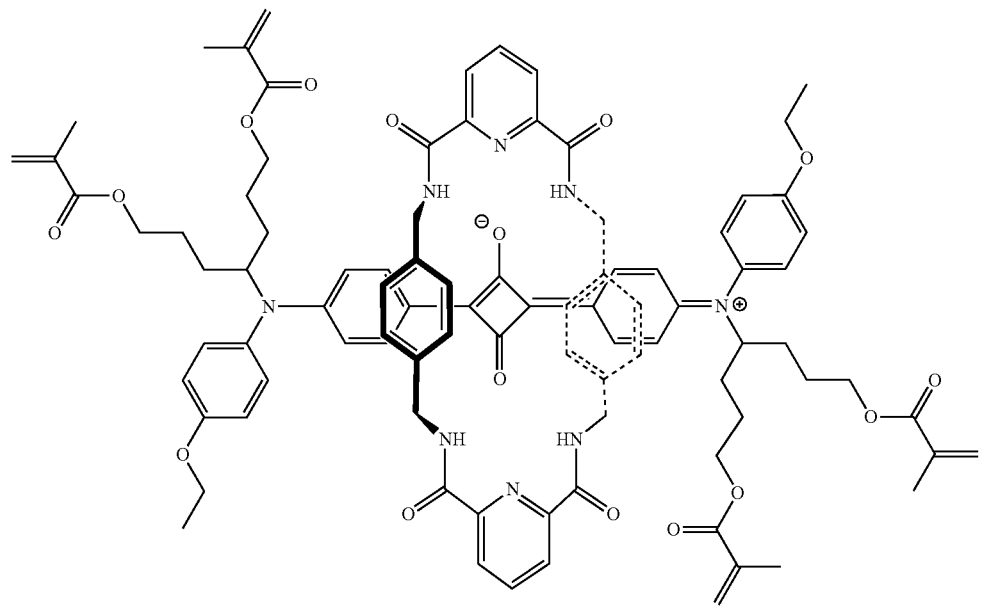

[Chemical Formula K]
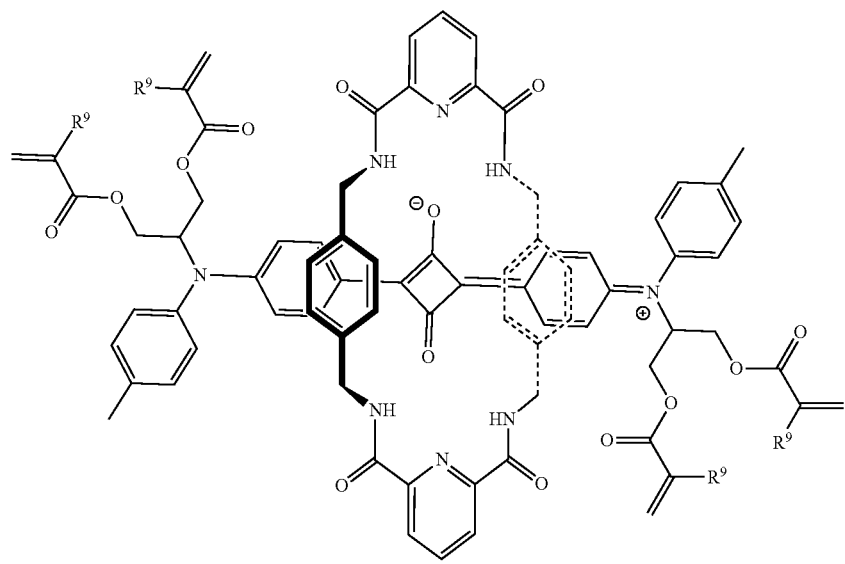
[Chemical Formula L]
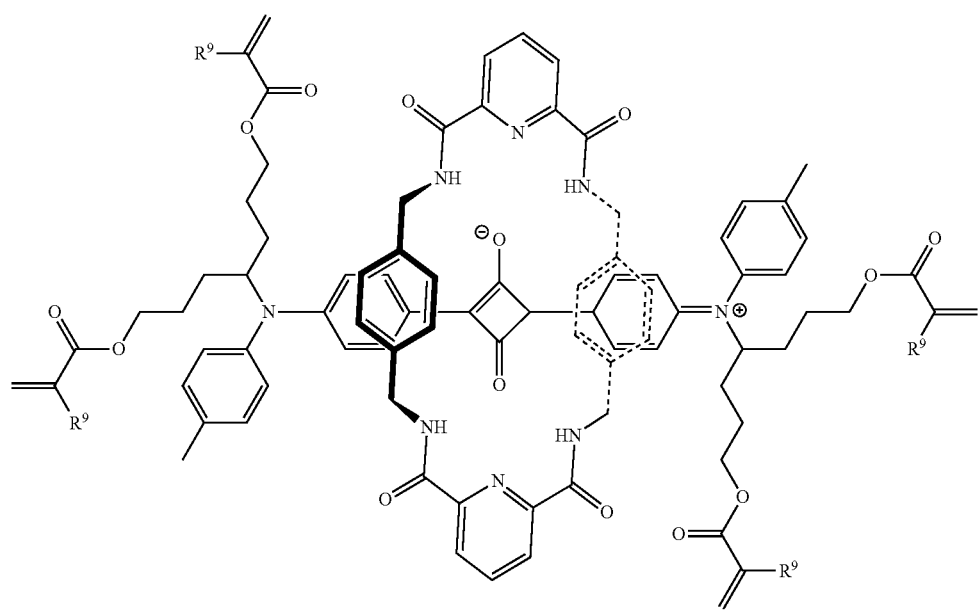

-continued

[Chemical Formula M]

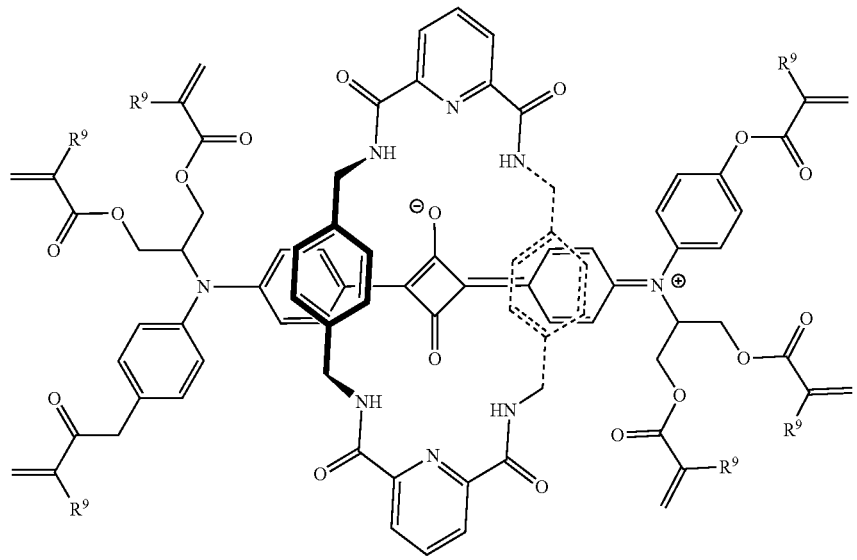

[Chemical Formula N]

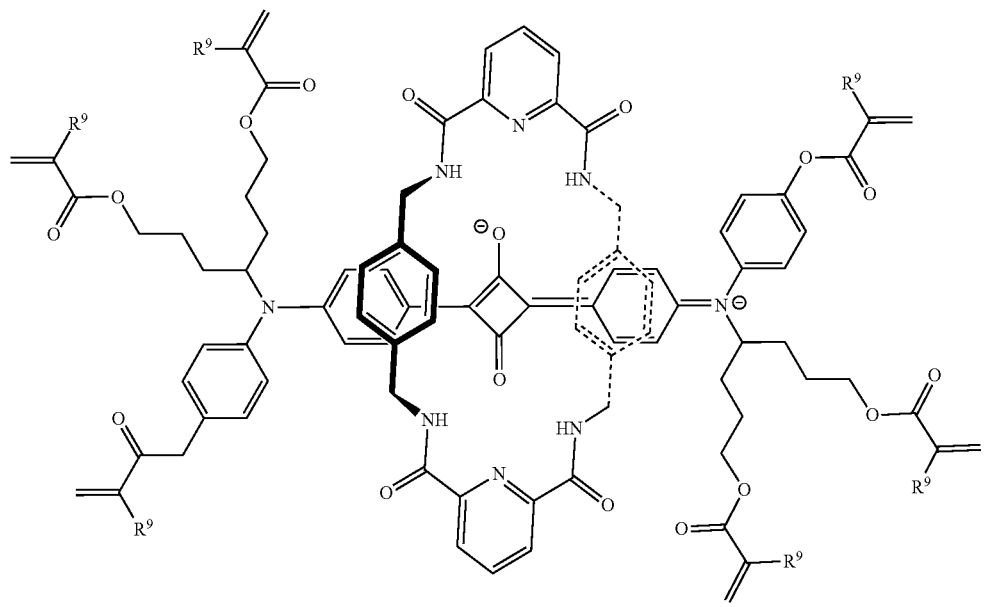

In Chemical Formula A to Chemical Formula N, $R^9$ may be, e.g., a hydrogen atom or a substituted or unsubstituted C1 to C10 alkyl group (e.g., a methyl group).

In an implementation, the core-shell compound may be a green dye.

According to another embodiment, a photosensitive resin composition including the core-shell compound according to the embodiment is provided.

In an implementation, the photosensitive resin composition may have a transmittance of greater than or equal to about 90% at 540 nm, a transmittance of less than or equal to about 10% at 600 nm to 640 nm, and a transmittance of less than or equal to about 5% at 450 nm and thus, may be suitable for realizing a green color filter for high transmission type CIS. In an implementation, the photosensitive resin composition may be used for a high transmission type CMOS image sensor.

The photosensitive resin composition may further include, e.g., a binder resin, a photopolymerizable monomer, a photopolymerization initiator, and a solvent.

The core-shell compound according to an embodiment may be included in an amount of about 15 wt % to about 30 wt %, e.g., about 16 wt % to about 27 wt %, based on a total weight of the photosensitive resin composition. When the core-shell compound according to an embodiment is included in the above range, color reproducibility and contrast ratio are improved, and may be applied to a CMOS image sensor.

In an implementation, the photosensitive resin composition may further include a pigment, e.g., a yellow pigment, a green pigment, or a combination thereof.

The yellow pigment may include, e.g., C.I. pigment yellow 138, C.I. pigment yellow 139, C.I. pigment yellow 150, or the like, in a color index, and these may be used alone or as a mixture of two or more.

The green pigment may include, e.g., C.I. pigment green 36, C.I. pigment green 58, C.I. pigment green 59, or the like, in a color index, and these may be used alone or as a mixture of two or more.

The pigment may be included in the photosensitive resin composition in the form of pigment dispersion.

The pigment dispersion may include a solid pigment, a solvent, and a dispersing agent for uniformly dispersing the pigment in the solvent.

In an implementation, the solid pigment may be included in an amount of about 1 wt % to about 20 wt %, e.g., about 8 wt % to about 20 wt %, about 8 wt % to about 15 wt %, about 10 wt % to about 20 wt %, or about 10 wt % to about 15 wt %, based on a total weight of pigment dispersion.

The dispersing agent may be, e.g., a non-ionic dispersing agent, an anionic dispersing agent, a cationic dispersing agent, or the like. Examples of the dispersing agent may include polyalkylene glycol and esters thereof, polyoxyalkylene, a polyhydric alcohol ester alkylene oxide addition product, an alcohol alkylene oxide addition product, sulfonate ester, a sulfonate salt, a carboxylate ester, a carboxylate salt, an alkylamide alkylene oxide addition product, alkyl amine, and the like, and these may be used alone or as a mixture of two or more.

Commercially available examples of the dispersing agent may include DISPERBYK-101, DISPERBYK-130, DISPERBYK-140, DISPERBYK-160, DISPERBYK-161, DISPERBYK-162, DISPERBYK-163, DISPERBYK-164, DISPERBYK-165, DISPERBYK-166, DISPERBYK-170, DISPERBYK-171, DISPERBYK-182, DISPERBYK-2000, DISPERBYK-2001, and the like made by BYK Co., Ltd.; EFKA-47, EFKA-47EA, EFKA-48, EFKA-49, EFKA-100, EFKA-400, EFKA-450, and the like made by EFKA Chemicals Co.; Solsperse 5000, Solsperse 12000, Solsperse 13240, Solsperse 13940, Solsperse 17000, Solsperse 20000, Solsperse24000GR, Solsperse 27000, Solsperse 28000, and the like made by Zeneka Co.; or PB711, PB821, and the like made by Ajinomoto Inc.

The dispersing agent may be included in an amount of, e.g., about 1 wt % to about 20 wt %, based on the total weight of the pigment dispersion. When the dispersing agent is included within the range, dispersion of a photosensitive resin composition is improved due to an appropriate viscosity, and thus optical, physical, and chemical quality may be maintained when the photosensitive resin composition is applied to products.

A solvent for forming the pigment dispersion may include ethylene glycol acetate, ethylcellosolve, propylene glycol methyletheracetate, ethyllactate, polyethylene glycol, cyclohexanone, propylene glycol methylether, or the like.

The pigment dispersion may be included in an amount of about 10 wt % to about 20 wt %, e.g., about 12 wt % to about 18 wt %, based on the total weight of the photosensitive resin composition. When the pigment dispersion is included within the above range, it is advantageous to secure a process margin, and may have improved color reproducibility and contrast ratio.

The binder resin may include an acrylic binder resin.

The acrylic binder resin may be, e.g., a copolymer of a first ethylenic unsaturated monomer and a second ethylenic unsaturated monomer that is copolymerizable therewith, and may be a resin including at least one acrylic repeating unit.

The first ethylenic unsaturated monomer may include, e.g., an ethylenic unsaturated monomer including at least one carboxyl group. Examples of the monomer may include acrylic acid, methacrylic acid, maleic acid, itaconic acid, fumaric acid, and a combination thereof.

The first ethylenic unsaturated monomer may be included in an amount of about 5 wt % to about 50 wt %, e.g., about 10 wt % to about 40 wt %, based on a total weight of the acrylic binder resin.

The second ethylenic unsaturated monomer may include an aromatic vinyl compound such as styrene, α-methylstyrene, vinyl toluene, vinylbenzylmethylether or the like; an unsaturated carboxylate ester compound such as methyl (meth)acrylate, ethyl(meth)acrylate, butyl(meth)acrylate, 2-hydroxyethyl(meth)acrylate, 2-hydroxy butyl(meth)acrylate, benzyl(meth)acrylate, cyclohexyl(meth)acrylate, phenyl(meth)acrylate, or the like; an unsaturated amino alkyl carboxylate ester compound such as 2-aminoethyl(meth)acrylate, 2-dimethylaminoethyl(meth)acrylate, or the like; a carboxylic acid vinyl ester compound such as vinyl acetate, vinyl benzoate, or the like; an unsaturated glycidyl carboxylate ester compound such as glycidyl(meth)acrylate or the like; a vinyl cyanide compound such as (meth)acrylonitrile or the like the like; an unsaturated amide compound such as (meth)acrylamide or the like; or the like, and may be used alone or as a mixture of two or more.

Examples of the acrylic binder resin may include a (meth)acrylic acid/benzylmethacrylate copolymer, a (meth)acrylic acid/benzylmethacrylate copolymer, a (meth)acrylic acid/benzylmethacrylate/styrene copolymer, a (meth)acrylic acid/benzylmethacrylate/2-hydroxyethylmethacrylate copolymer, a (meth)acrylic acid/benzylmethacrylate/styrene/2-hydroxyethylmethacrylate copolymer, and the like, and these may be used alone or as a mixture of two or more.

A weight average molecular weight of the binder resin may be about 3,000 g/mol to about 150,000 g/mol, e.g., about 5,000 g/mol to about 50,000 g/mol, or about 20,000 g/mol to about 30,000 g/mol. When the binder resin has a weight average molecular weight within the range, the photosensitive resin composition has good physical and chemical properties, appropriate viscosity, and close-contacting properties with a substrate during manufacture of a color filter.

An acid value of the binder resin may be about 15 mgKOH/g to about 60 mgKOH/g, e.g., about 20 mgKOH/g to about 50 mgKOH/g. When the acid value of the binder resin is within the range, resolution of pixel patterns is improved.

The binder resin may be included in an amount of about 1 wt % to about 30 wt %, e.g., about 1 wt % to about 20 wt %, based on the total weight of the photosensitive resin composition. When the binder resin is included within the range, the composition may have an excellent developability and improved crosslinking, and thus has excellent surface flatness when manufactured into a color filter.

The photopolymerizable monomer may be mono-functional or multi-functional ester of (meth)acrylic acid including at least one ethylenic unsaturated double bond.

The photopolymerizable monomer has the ethylenic unsaturated double bond and thus, may cause sufficient polymerization during exposure in a pattern-forming process and form a pattern having excellent heat resistance, light resistance, and chemical resistance.

Examples of the photopolymerizable monomer may include ethylene glycol di(meth)acrylate, diethylene glycol di(meth)acrylate, triethylene glycol di(meth)acrylate, propylene glycol di(meth)acrylate, neopentyl glycol di(meth)acrylate, 1,4-butanediol di(meth)acrylate, 1,6-hexanediol di(meth)acrylate, bisphenol A di(meth)acrylate, pentaerythritol di(meth)acrylate, pentaerythritol tri(meth)acrylate, pentaerythritol tetra(meth)acrylate, pentaerythritol hexa(meth)acrylate, dipentaerythritol di(meth)acrylate, dipentaerythritol tri(meth)acrylate, dipentaerythritol penta (meth)acrylate, dipentaerythritol hexa(meth)acrylate, bisphenol A epoxy(meth)acrylate, ethylene glycol monomethylether (meth)acrylate, trimethylol propane tri(meth)acrylate, tris(meth)acryloyloxyethyl phosphate, novolac epoxy (meth)acrylate, and the like.

Commercially available examples of the photopolymerizable monomer may be as follows. The mono-functional (meth)acrylic acid ester may include Aronix M-101 ®, M-111 ®, M-114 ® (Toagosei Chemistry Industry Co., Ltd.); KAYARAD TC-110S®, TC-120S® (Nippon Kayaku Co., Ltd.); V-158 ®, V-2311 (Osaka Organic Chemical Ind., Ltd.), and the like. Examples of a difunctional (meth)acrylic acid ester may include Aronix M-210 ®, M-240 ®, M-6200 ® (Toagosei Chemistry Industry Co., Ltd.), KAYARAD HDDA®, HX-220 ®, R-604 ® (Nippon Kayaku Co., Ltd.), V-260 ®, V-312 ®, V-335 HP® (Osaka Organic Chemical Ind., Ltd.), and the like. Examples of a tri-functional (meth) acrylic acid ester may include Aronix M-309 ®, M-400 ®, M-405 ®, M-450 ®, M-710 ®, M-8030 ®, M-8060 ®, and the like of Toagosei Chemistry Industry Co., Ltd.; KAYARAD TMPTA®, DPCA-20 ®, DPCA-30 ®, DPCA-60 ®, DPCA-120 ® of Nippon Kayaku Co., Ltd., V-295 ®, V-300 ®, V-360 ®, V-GPT®, V-3PA®, V-400 ® of Osaka Yuki Kayaku Kogyo Co. Ltd., and the like. These may be used alone or as a mixture of two or more.

The photopolymerizable monomer may be treated with acid anhydride to help improve developability.

The photopolymerizable monomer may be included in an amount of about 1 wt % to about 15 wt %, e.g., about 5 wt % to about 10 wt %, based on the total weight of the photosensitive resin composition. When the photopolymerizable monomer is included within the ranges, the photopolymerizable monomer is sufficiently cured during exposure in a pattern-forming process and has excellent reliability, and developability for alkali developing solution may be improved.

The photopolymerization initiator may be a suitable initiator for a photosensitive resin composition, e.g., an acetophenone compound, a benzophenone compound, a thioxanthone compound, a benzoin compound, a triazine compound, an oxime compound, or a combination thereof.

Examples of the acetophenone compound may include 2,2'-diethoxy acetophenone, 2,2'-dibutoxy acetophenone, 2-hydroxy-2-methylpropinophenone, p-t-butyltrichloro acetophenone, p-t-butyldichloro acetophenone, 4-chloro acetophenone, 2,2'-dichloro-4-phenoxy acetophenone, 2-methyl-1-(4-(methylthio)phenyl)-2-morpholinopropan-1-one, 2-benzyl-2-dimethylamino-1-(4-morpholinophenyl)-butan-1-one, and the like.

Examples of the benzophenone compound may include benzophenone, benzoyl benzoate, benzoyl methyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like.

Examples of the thioxanthone compound may include thioxanthone, 2-methylthioxanthone, isopropyl thioxanthone, 2,4-diethyl thioxanthone, 2,4-diisopropyl thioxanthone, 2-chlorothioxanthone, and the like.

Examples of the benzoin compound may include benzoin, benzoin methyl ether, benzoin ethyl ether, benzoin isopropyl ether, benzoin isobutyl ether, benzyldimethylketal, and the like.

Examples of the triazine compound may include 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl 4,6-bis(trichloromethyp-s-triazine, bis(trichloromethyl)-6-styryl-s-triazine, 2-(naphtho1-yl)-4,6-bis (trichloromethyp-s-triazine, 2-(4-methoxynaphtho1-yl)-4,6-bis(trichloromethyl)-s-triazine, 2-4-bis(trichloromethyl)-6-piperonyl-s-triazine, 2-4-bis(trichloromethyl)-6-(4-methoxystyryl)-s-triazine, and the like.

Examples of the oxime compound may include an O-acyloxime compound, 2-(o-benzoyloxime)-1-[4-(phenylthio) phenyl]-1,2-octandione, 1-(o-acetyloxime)-1-[9-ethyl-6-(2-methylbenzoyl)-9H-carbazol-3-yl]ethanone, 0-ethoxycarbonyl-α-oxyamino-1-phenylpropan-1-one, and the like. Examples of the O-acyloxime compound may include 1,2-octandione, 2-dimethylamino-2-(4-methylbenzyl)-1-(4-morpholin-4-yl-phenyl)-butan-1-one, 1-(4-phenylsulfanyl phenyl)-butane-1,2-dione2-oxime-O-benzoate, 1-(4-phenylsulfanyl phenyl)-octane-1,2-dione2-oxime-O-benzoate, 1-(4-phenylsulfanyl phenyl)-octan-1-oneoxime-O-acetate, and 1-(4-phenylsulfanyl phenyl)-butan-1-oneoxime-O-acetate, and the like.

In an implementation, the photopolymerization initiator may further include a carbazole compound, a diketone compound, a sulfonium borate compound, a diazo compound, an imidazole compound, a biimidazole compound, a fluorene-bed compound, or the like.

The photopolymerization initiator may be used with a photosensitizer capable of causing a chemical reaction by absorbing light and becoming excited and then, transferring its energy.

Examples of the photosensitizer may include tetraethylene glycol bis-3-mercapto propionate, pentaerythritol tetrakis-3-mercapto propionate, dipentaerythritol tetrakis-3-mercapto propionate, and the like.

The photopolymerization initiator may be included in an amount of about 0.01 wt % to about 10 wt %, e.g., about 0.1 wt % to about 5 wt %, based on the total weight of the photosensitive resin composition. When the photopolymerization initiator is included within the ranges, sufficient photopolymerization occurs during exposure in a pattern-forming process, excellent reliability may be realized, heat resistance, light resistance, and chemical resistance of patterns, resolution and close-contacting properties may be improved, and decrease of transmittance due to a non-reaction initiator may be prevented.

The solvent may be a material having compatibility with the core-shell compound, pigment according to an embodiment, the binder resin, the photopolymerizable monomer, and the photopolymerization initiator, but not reacting therewith.

Examples of the solvent may include alcohols such as methanol, ethanol, and the like; ethers such as dichloroethyl ether, n-butyl ether, diisoamyl ether, methylphenyl ether, tetrahydrofuran, and the like; glycol ethers such as ethylene glycol monomethylether, ethylene glycol monoethylether, and the like; cellosolve acetates such as methyl cellosolve acetate, ethyl cellosolve acetate, diethyl cellosolve acetate, and the like; carbitols such as methylethyl carbitol, diethyl carbitol, diethylene glycol monomethylether, diethylene glycol monoethylether, diethylene glycol dimethylether, diethylene glycol methylethylether, diethylene glycol diethylether, and the like; propylene glycol alkylether acetates such as propylene glycol monomethylether acetate, propylene glycol propylether acetate, and the like; aromatic hydrocarbons such as toluene, xylene, and the like; ketones such as methylethylketone, cyclohexanone, 4-hydroxy-4-methyl-2-pentanone, methyl-n-propylketone, methyl-n-butylketone, methyl-n-amylketone, 2-heptanone, and the like; saturated aliphatic monocarboxylic acid alkyl esters such as ethyl acetate, n-butyl acetate, isobutyl acetate, and the like; lactic acid esters such as methyl lactate, ethyl lactate, and the like; oxy acetic acid alkyl esters such as oxy methyl acetate, oxy ethyl acetate, oxy butyl acetate, and the like; alkoxy acetic acid alkyl esters such as methoxy methyl acetate, methoxy ethyl acetate, methoxy butyl acetate, ethoxy methyl acetate, ethoxy ethyl acetate, and the like; 3-oxy propionic acid alkylesters such as 3-oxy methyl propionate, 3-oxy ethyl propionate, and the like; 3-alkoxy propionic acid alkyl esters such as 3-methoxy methyl propionate, 3-methoxy ethyl propionate, 3-ethoxy ethyl propionate, 3-ethoxy methyl propionate, and the like; 2-oxy propionic acid alkyl esters such as 2-oxy methyl propionate, 2-oxy ethyl propionate, 2-oxy propyl propionate, and the like; 2-alkoxy propionic acid alkyl esters such as 2-methoxy methyl propionate, 2-methoxy ethyl propionate, 2-ethoxy ethyl propionate, 2-ethoxy methyl propionate, and the like; 2-oxy-2-methyl propionic acid esters such as 2-oxy-2-methyl methyl propionate, 2-oxy-2-methyl ethyl propionate, and the like, monooxy monocarboxylic acid alkyl esters of 2-alkoxy-2-methyl alkyl propionates such as 2-methoxy-2-methyl methyl propionate, 2-ethoxy-2-methyl ethyl propionate, and the like; esters such as 2-hydroxy ethyl propionate, 2-hydroxy-2-methyl ethyl propionate, hydroxy ethyl acetate, 2-hydroxy-3-methyl methyl butanoate, and the like; ketonate esters such as ethyl pyruvate, and the like, and in addition, a high boiling point solvent such as N-methylformamide, N,N-dimethylformamide, N-methylformanilide, N-methylacetamide, N,N-dimethylacetamide, N-methylpyrrolidone, dimethylsulfoxide, benzylethylether, dihexylether, acetylacetone, isophorone, caproic acid, caprylic acid, 1-octanol, 1-nonanol, benzylalcohol, benzyl acetate, ethyl benzoate, diethyl oxalate, diethyl maleate, γ-butyrolactone, ethylene carbonate, propylene carbonate, phenyl cellosolve acetate, and the like may also be used.

With a view toward compatibility and reactivity, glycol ethers such as ethylene glycol monoethylether, and the like; ethylene glycol alkylether acetates such as ethyl cellosolve acetate, and the like; esters such as 2-hydroxy ethyl propionate, and the like; carbitols such as diethylene glycol monomethylether, and the like; propylene glycol alkylether acetates such as propylene glycol monomethylether acetate, propylene glycol propylether acetate, and the like; or ketones such as cyclohexanone, and the like may be used.

The solvent may be included in a balance amount, e.g., about 30 wt % to about 80 wt %, based on the total weight of the photosensitive resin composition. When the solvent is included within the ranges, the photosensitive resin composition may have an appropriate viscosity resulting in improvement of coating characteristics of a color filter.

The photosensitive resin composition according to another embodiment may further include an epoxy compound in order to improve close-contacting properties with a substrate.

Examples of the epoxy compound may include a phenol novolac epoxy compound, a tetramethyl biphenyl epoxy compound, a bisphenol A epoxy compound, an alicyclic epoxy compound, or a combination thereof.

The epoxy compound may be included in an amount of about 0.01 parts by weight to about 20 parts by weight, e.g., about 0.1 parts by weight to about 10 parts by weight, based on 100 parts by weight of the photosensitive resin composition. When the epoxy compound is included within the range, close-contacting properties, storage properties, and the like may be improved.

In an implementation, the photosensitive resin composition may further include a silane coupling agent having a reactive substituent such as a carboxyl group, a methacryloyl group, an isocyanate group, an epoxy group, or the like to help improve adherence to a substrate.

Examples of the silane coupling agent may include trimethoxysilyl benzoic acid, γ-methacryl oxypropyl trimethoxysilane, vinyl triacetoxysilane, vinyl trimethoxysilane, γ-isocyanate propyl triethoxysilane, γ-glycidoxy propyl trimethoxysilane, (3-(epoxycyclohexyl)ethyltrimethoxysilane, and the like, and these may be used alone or in a mixture of two or more.

The silane coupling agent may be included in an amount of about 0.01 parts by weight to about 10 parts by weight, based on 100 parts by weight of the photosensitive resin composition. When the silane coupling agent is included within the range, close-contacting properties, storing properties, and the like may be improved.

In an implementation, the photosensitive resin composition may further include a surfactant in order to help improve coating properties and prevent a defect.

Examples of the surfactant may include fluorine surfactants that are commercially available as BM-1000 ®, BM-1100 ®, and the like of BM Chemie Inc.; F 142D®, F 172 ®, F 173 ®, F 183 ®, and the like of Dainippon Ink Kagaku Kogyo Co., Ltd.; FULORAD FC-135 ®, FC-170C®, FC-430 ®, FC-431 ®, and the like of Sumitomo 3M Co., Ltd.; SURFLON S-112 ®, S-113 ®, S-131 ®, S-141 ®, S-145 ®, and the like of ASAHI Glass Co., Ltd.; SH-28PA®, SH-190 ®, SH-193 ®, SZ-6032 ®, SF-8428 ®, and the like.

The surfactant may be included in an amount of about 0.001 parts by weight to about 5 parts by weight, based on 100 parts by weight of the photosensitive resin composition. When the surfactant is included within the range, the coating uniformity may be secured, stains may not be found, and the wetting property to the glass substrate may be improved.

In an implementation, the photosensitive resin composition may further include other suitable additives such as an oxidization inhibitor, a stabilizer, or the like in a predetermined amount, unless properties are deteriorated.

According to another embodiment, a photosensitive resin layer manufactured using the photosensitive resin composition according to an embodiment is provided.

According to another embodiment, a color filter including the photosensitive resin layer is provided.

A pattern-forming process in the color filter may be as follows.

The process may include, e.g., coating the photosensitive resin composition according to an embodiment on a support substrate in a method of spin coating, slit coating, inkjet printing, and the like; drying the coated (e.g., positive) photosensitive resin composition to form a photosensitive resin composition film; exposing the (e.g., positive) photosensitive resin composition film to light; developing the exposed (e.g., positive) photosensitive resin composition film in an alkali aqueous solution to obtain a photosensitive resin layer; and heat-treating the photosensitive resin layer.

Another embodiment provides a CMOS image sensor including the color filter.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Synthesis of Compounds

Synthesis Example 1: Synthesis of Compound Represented by Chemical Formula A

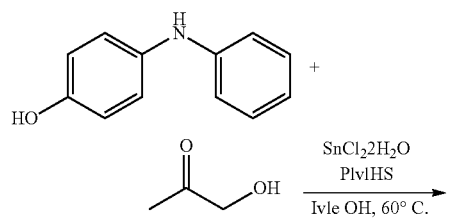

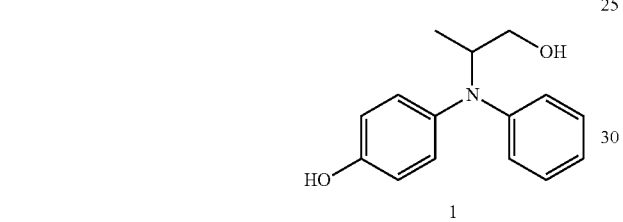

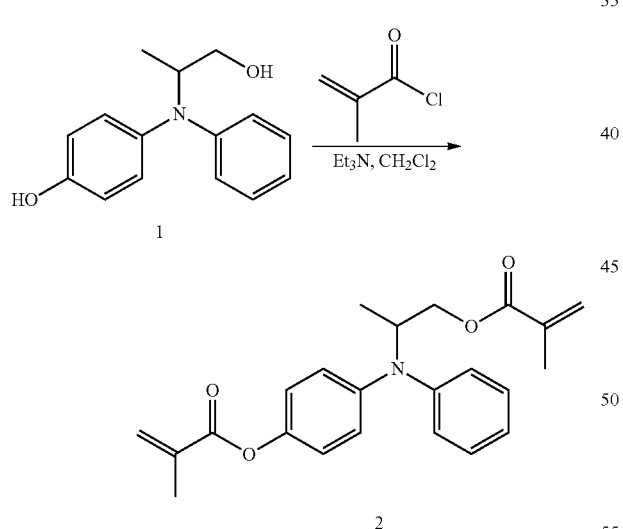

4-hydroxydiphenylamine (0.1 mol), hydroxyacetone (0.15 mol), $SnCl_2 2H_2O$ (0.02 mol), and poly(methylhyrdosiloxane) (0.2 mol) were added to methanol and then, heated at 60° C. and stirred for 10 hours. A polymer produced therein was removed through filtering, and after distilling a portion of the methanol under a reduced pressure, the residue was extracted with ethyl acetate and washed with 10% HCl and water. The extracted organic layer was distilled under a reduced pressure and purified through column chromatography, obtaining Intermediate 1.

Intermediate 1 (0.05 mol) and Et3N (0.11 mol) were added to dichloromethane, after correcting the temperature to 0° C., methacryloyl chloride (1.05 mol) was slowly added thereto in a dropwise fashion and stirred for 2 hours. A resultant therefrom was extracted with dichloromethane and washed with water. The extracted organic layer was distilled under a reduced pressure and purified through column chromatography, obtaining Intermediate 2.

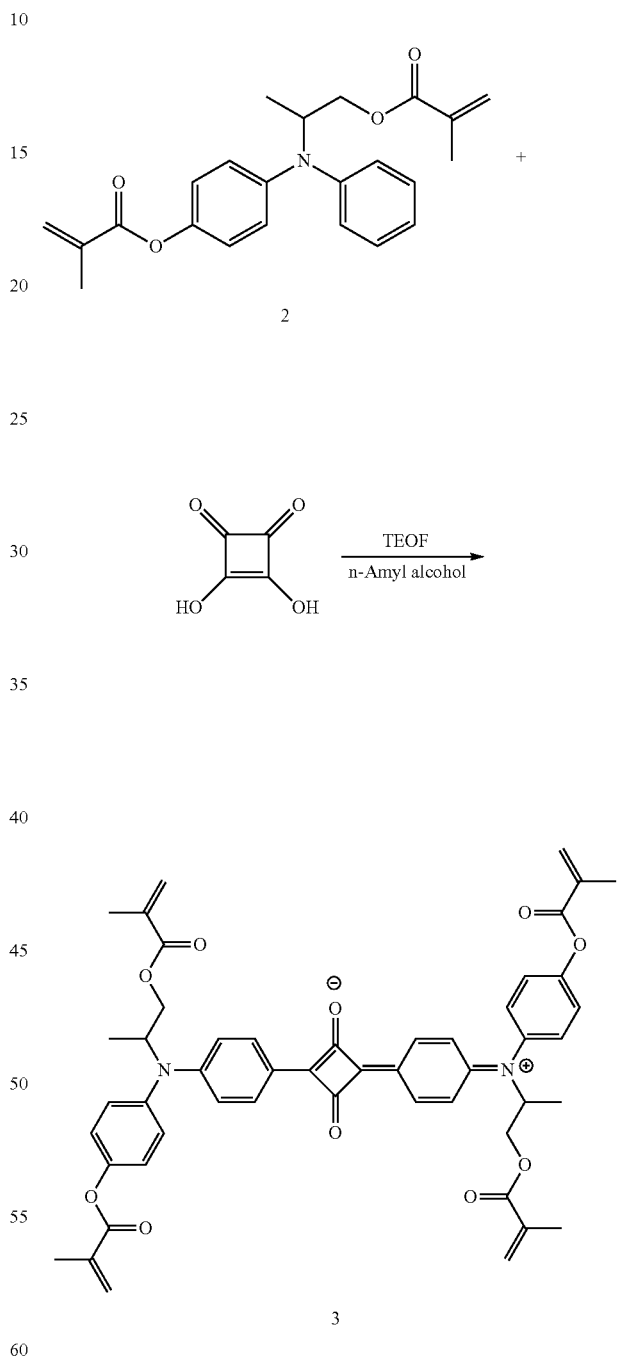

Intermediate 2 (0.01 mol), squaric acid (0.05 mol), and triethylorthoformate (TEOF) (0.15 mol) were added to amyl alcohol and then, heated at 90° C. and stirred for 7 hours. After distilling off the amyl alcohol under a reduced pressure, the residue was purified through column chromatography, obtaining Intermediate 3.

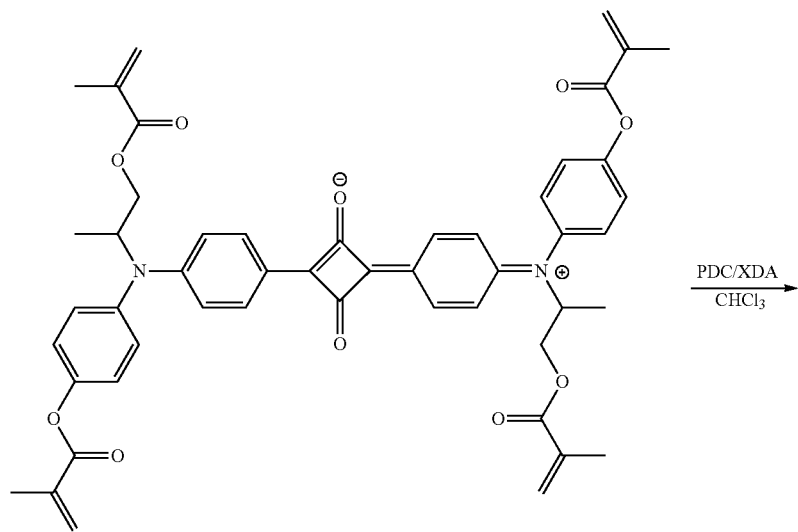
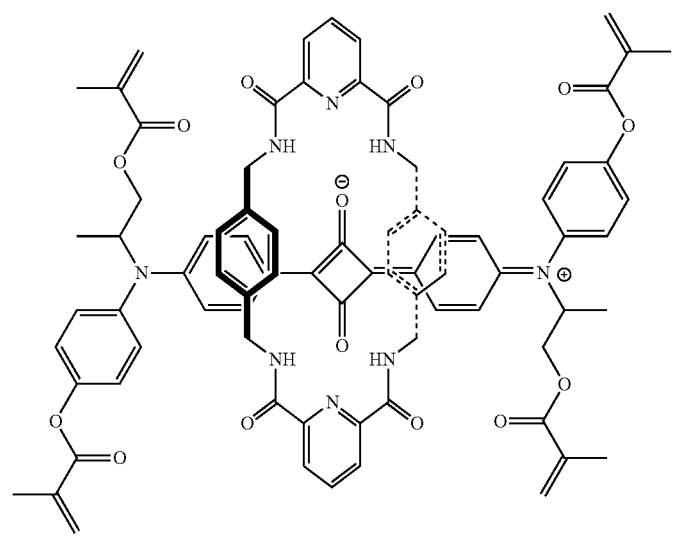

(Encap Method) Intermediate 3 (5 mmol) was dissolved in 600 mL of a chloroform solvent, and a solution prepared by dissolving 2,6-pyridinedicarbonyl dichloride (20 mmol) and p-xylylene diamine (20 mmol) in 60 mL of a chloroform solvent was added dropwise thereto at room temperature for 5 hours. After 12 hours, the obtained mixture was distilled under a reduced pressure and columned, synthesizing a compound represented by Chemical Formula A.

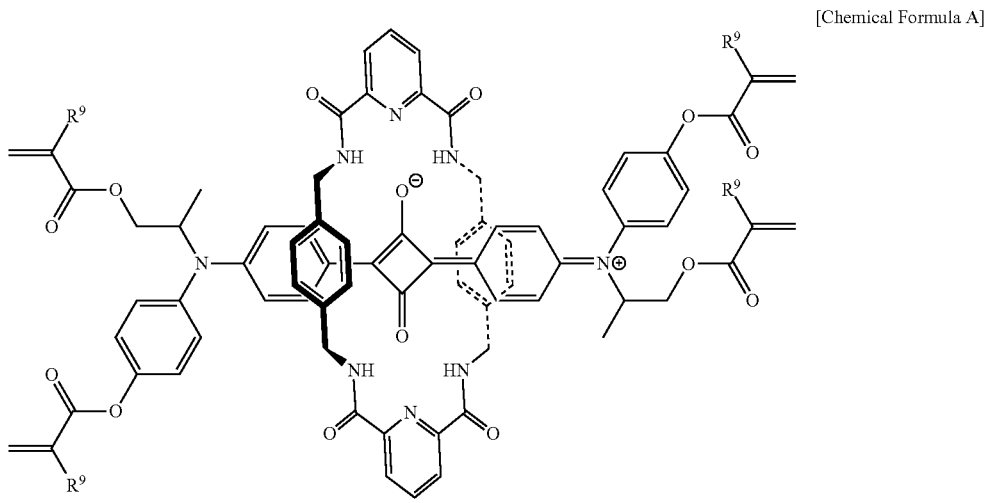

[Chemical Formula A]

MALDI-TOF MS: $R^9$=methyl (1370.53) m/z

MALDI-TOF MS: $R^9$=H (1314.47) m/z (In this case, acryloyl chloride may be used instead of methacryloyl chloride when synthesizing Intermediate 2.)

Synthesis Example 2: Synthesis of Compound Represented by Chemical Formula B

A compound represented by Chemical Formula B was synthesized in the same manner as in Synthesis Example 1 except that 5-hydroxy-2-pentanone was used.

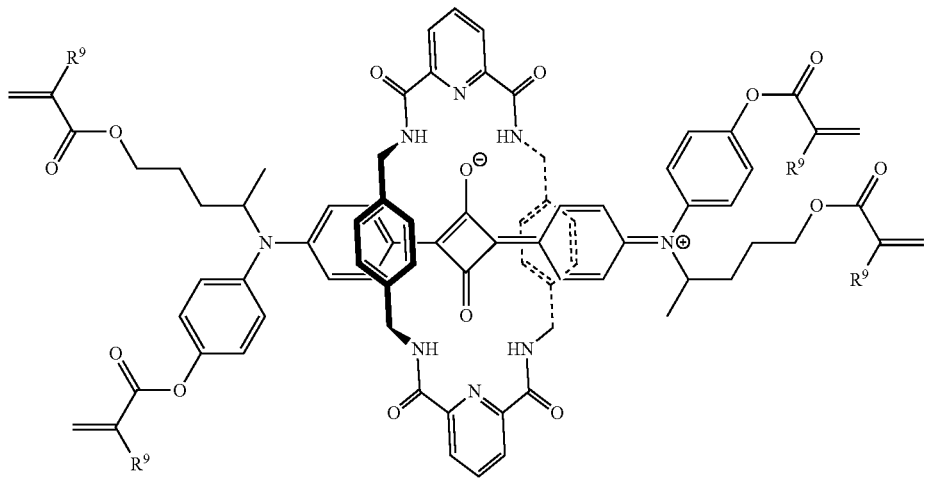

[Chemical Formula B]

MALDI-TOF MS: $R^9$=methyl (1426.59) m/z

MALDI-TOF MS: $R^9$=H (1370.52) m/z (In this case, acryloyl chloride may be used instead of methacryloyl chloride when synthesizing Intermediate 2.)

Synthesis Example 3: Synthesis of Compound Represented by Chemical Formula C

A compound represented by Chemical Formula C was synthesized in the same manner as in Synthesis Example 1 except that 2,3-dimethyl-4-hydroxydiphenylamine was used.

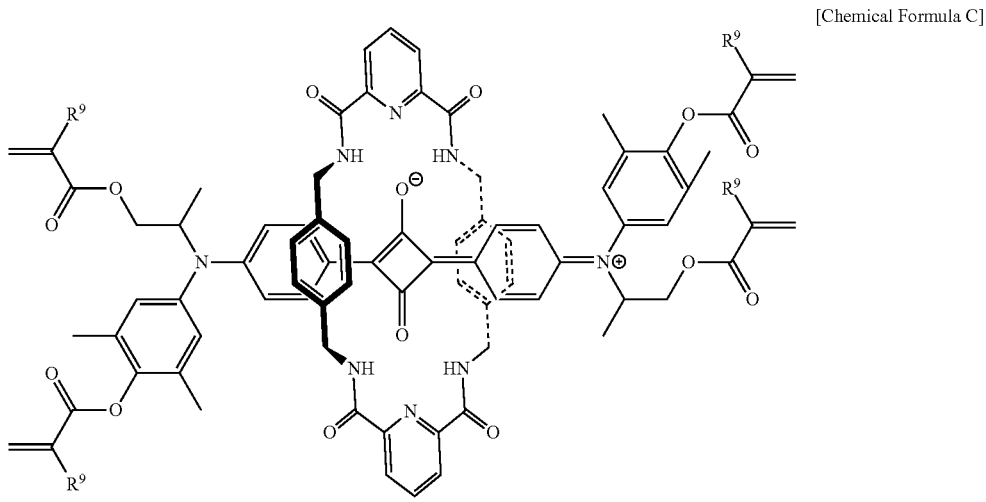

[Chemical Formula C]

MALDI-TOF MS: $R^9$=methyl (1426.59) m/z
MALDI-TOF MS: $R^9$=H (1370.53) m/z (In this case, acryloyl chloride may be used instead of methacryloyl chloride when synthesizing Intermediate 2.)

Synthesis Example 4: Synthesis of Compound Represented by Chemical Formula D

A compound represented by Chemical Formula D was synthesized in the same manner as in Synthesis Example 1 except that 2,3-dimethyl-4-hydroxydiphenylamine and 5-hydroxy-2-pentanone were used.

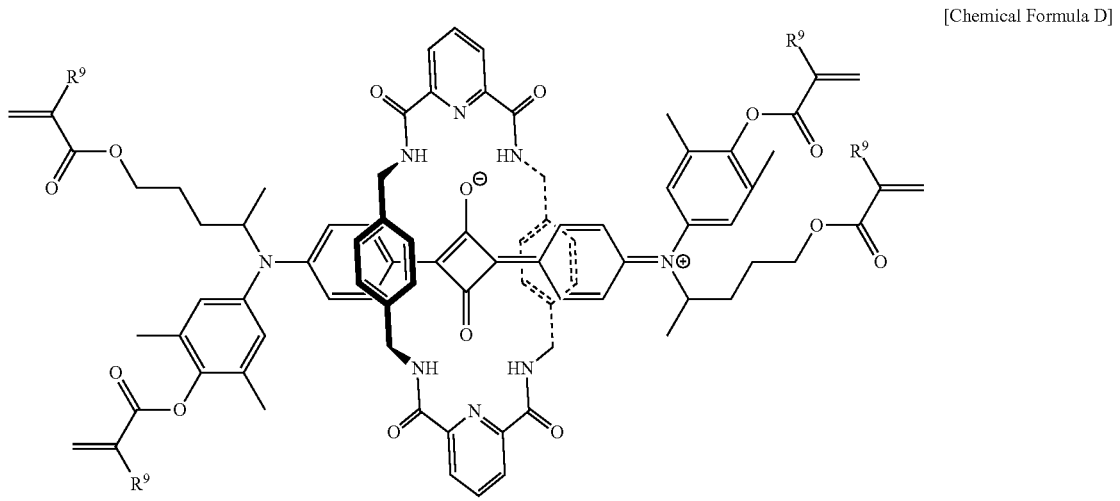

[Chemical Formula D]

MALDI-TOF MS: $R^9$=methyl (1482.65) m/z
MALDI-TOF MS: $R^9$=H (1426.59) m/z (In this case, acryloyl chloride may be used instead of methacryloyl chloride when synthesizing Intermediate 2.)

Synthesis Example 5: Synthesis of Compound Represented by Chemical Formula E A compound represented by Chemical Formula E was synthesized in the same manner as in Synthesis Example 1 except that 4-methyl-3-hydroxydiphenylamine and hydroxyacetone were used.

[Chemical Formula E]

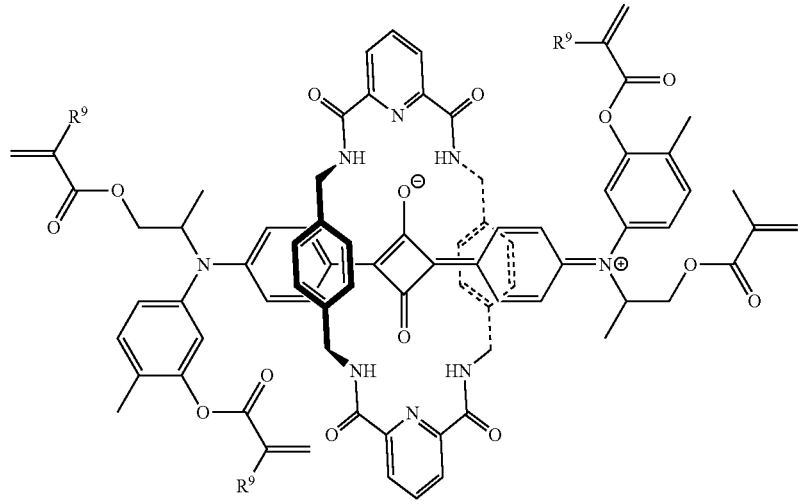

MALDI-TOF MS: $R^9$=methyl (1398.56) m/z
MALDI-TOF MS: $R^9$=H (1342.50) m/z (In this case, acryloyl chloride may be used instead of methacryloyl chloride when synthesizing Intermediate 2.)

Synthesis Example 6: Synthesis of Compound Represented by Chemical Formula F A compound represented by Chemical Formula F was synthesized in the same manner as in Synthesis Example 1 except that 4-methyl-3-hydroxydiphenylamine and 5-hydroxy-2-pentanone were used.

[Chemical Formula F]

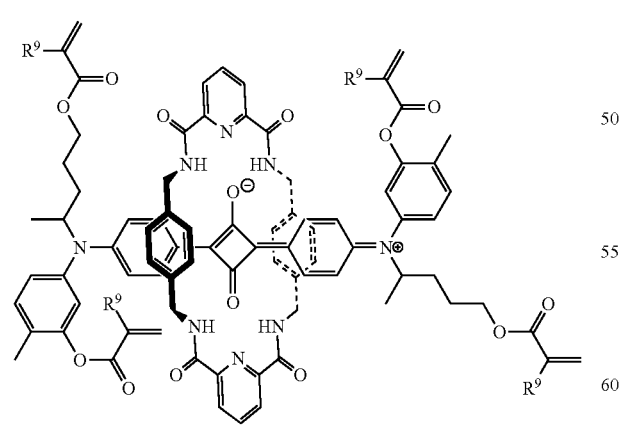

MALDI-TOF MS: $R^9$=methyl (1454.62) m/z
MALDI-TOF MS: $R^9$=H (1398.56) m/z (In this case, acryloyl chloride may be used instead of methacryloyl chloride when synthesizing Intermediate 2.)

Synthesis Example 7: Synthesis of Compound Represented by Chemical Formula G

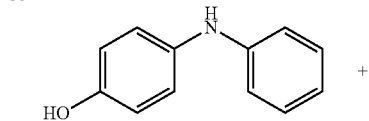

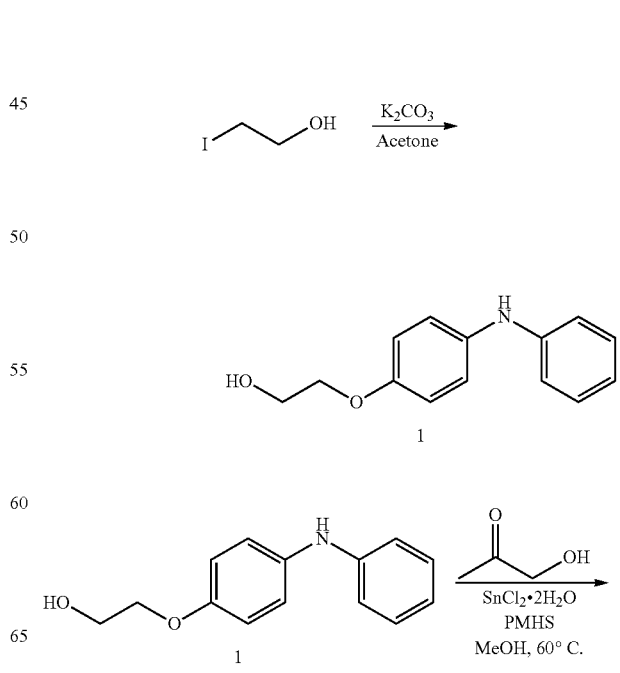

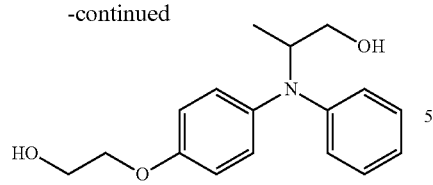

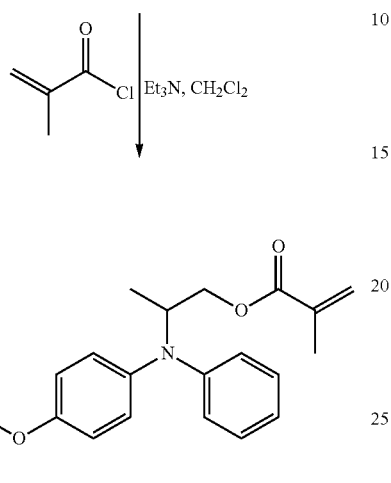

4-hydroxydiphenylamine (0.1 mol), 2-iodoethaneol (0.12 mol), and $K_2CO_3$ (0.15 mol) were added to acetone and then, heated at 50° C. and stirred for 12 hours. The obtained mixture was extracted with ethyl acetate and washed with water. The extracted organic layer was distilled under a reduced pressure and purified through column chromatography, obtaining Intermediate 1.

Other intermediate synthesis processes were performed according to the same method as Synthesis Example 1, synthesizing a compound represented by Chemical Formula G.

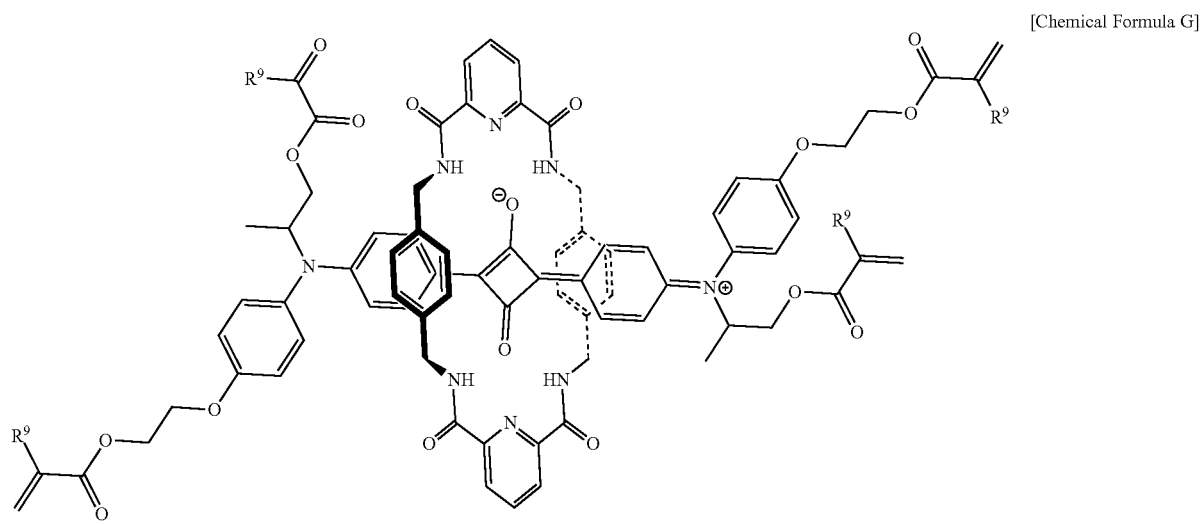

[Chemical Formula G]

MALDI-TOF MS: $R^9$=methyl (1486.61) m/z

MALDI-TOF MS: $R^9$=H (1430.55) m/z (In this case, acryloyl chloride may be used instead of methacryloyl chloride.)

Synthesis Example 8: Synthesis of Compound Represented by Chemical Formula H

A compound represented by Chemical Formula H was synthesized in the same manner as in Synthesis Example 7, except that 5-hydroxy-2-pentanone was used.

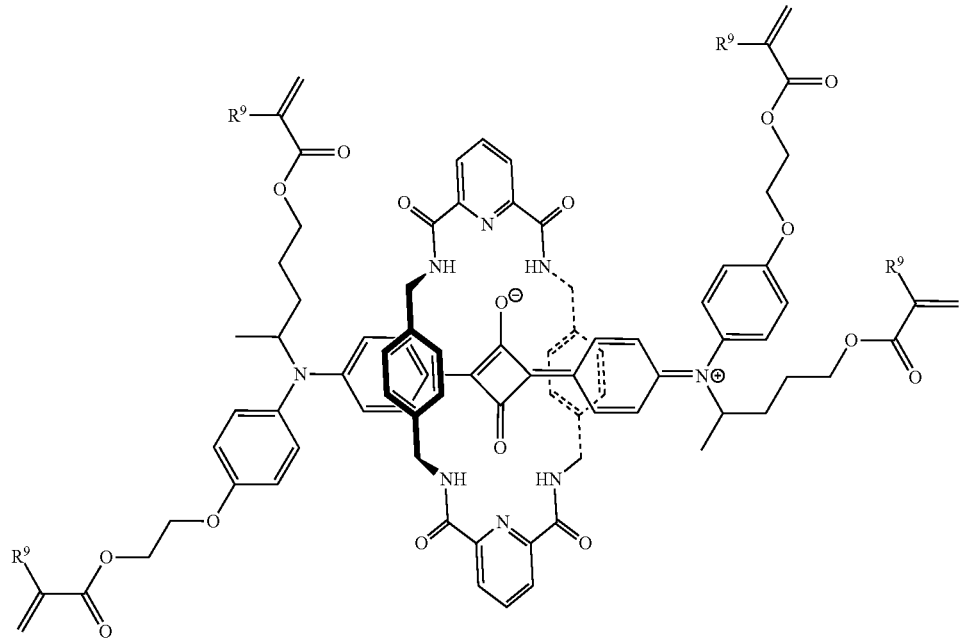

[Chemical Formula H]

MALDI-TOF MS: $R^9$=methyl (1514.67) m/z

MALDI-TOF MS: $R^9$=H (1456.60) m/z (In this case, acryloyl chloride may be used instead of methacryloyl chloride.)

Synthesis Example 9: Synthesis of Compound Represented by Chemical Formula I

A compound represented by Chemical Formula I was synthesized in the same manner as in Synthesis Example 1, except that 1-bromobutane and 1,3-dihydroxyacetone were used.

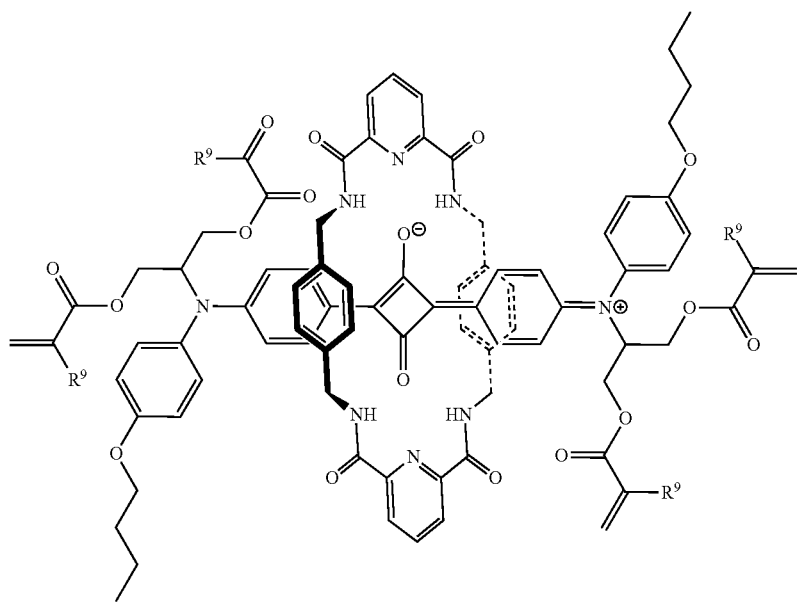

[Chemical Formula I]

MALDI-TOF MS: $R^9$=methyl (1514.64) ink
MALDI-TOF MS: $R^9$=H (1458.58) m/z (In this case, acryloyl chloride may be used instead of methacryloyl chloride when synthesizing Intermediate 2.)

Synthesis Example 10: Synthesis of Compound Represented by Chemical Formula K

A compound represented by Chemical Formula K was synthesized in the same manner as in Synthesis Example 1, except that 1,3-dihydroxyacetone and 4-methyldiphenylamine were used.

[Chemical Formula K]

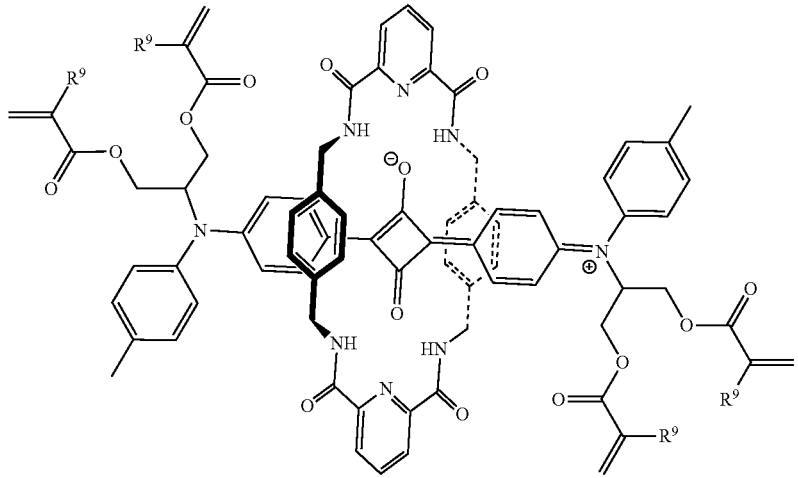

MALDI-TOF MS: $R^9$=methyl (1398.56) m/z
MALDI-TOF MS: $R^9$=H (1342.50) m/z (In this case, acryloyl chloride may be used instead of methacryloyl chloride when synthesizing Intermediate 2.)

Synthesis Example 11: Synthesis of Compound Represented by Chemical Formula M

A compound represented by Chemical Formula M was synthesized in the same manner as in Synthesis Example 1, except that 4-hydroxydiphenylamine and 1,3-dihydroxyacetone were used.

[Chemical Formula M]

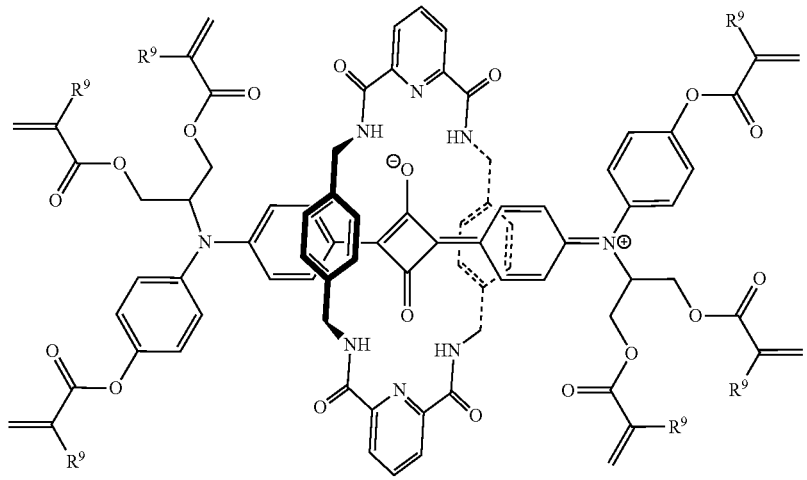

MALDI-TOF MS: $R^9$=methyl (1538.57) m/z
MALDI-TOF MS: $R^9$=H (1454.48) m/z (In this case, acryloyl chloride may be used instead of methacryloyl chloride when synthesizing Intermediate 2.)
Synthesis Example 12: Synthesis of Compound Represented by Chemical Formula O
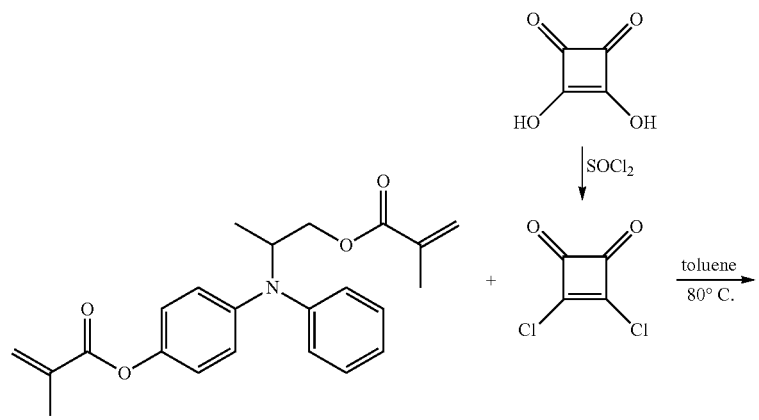
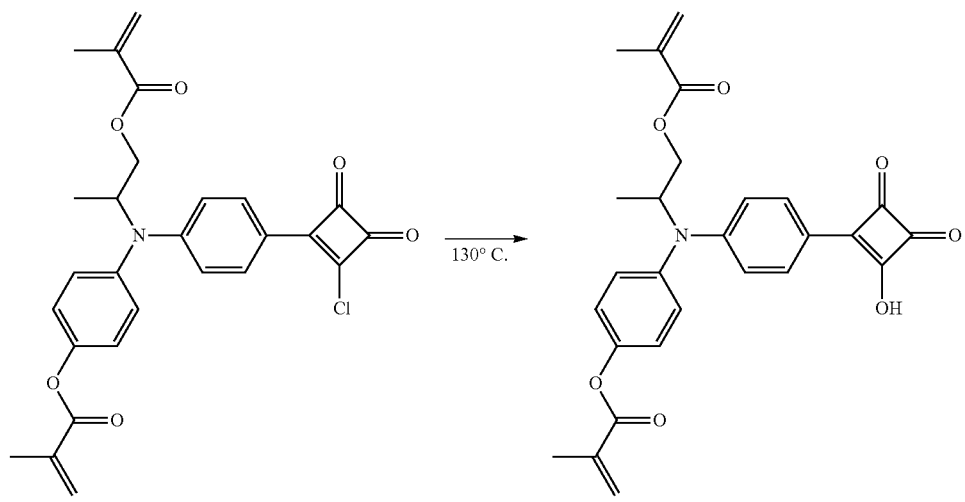

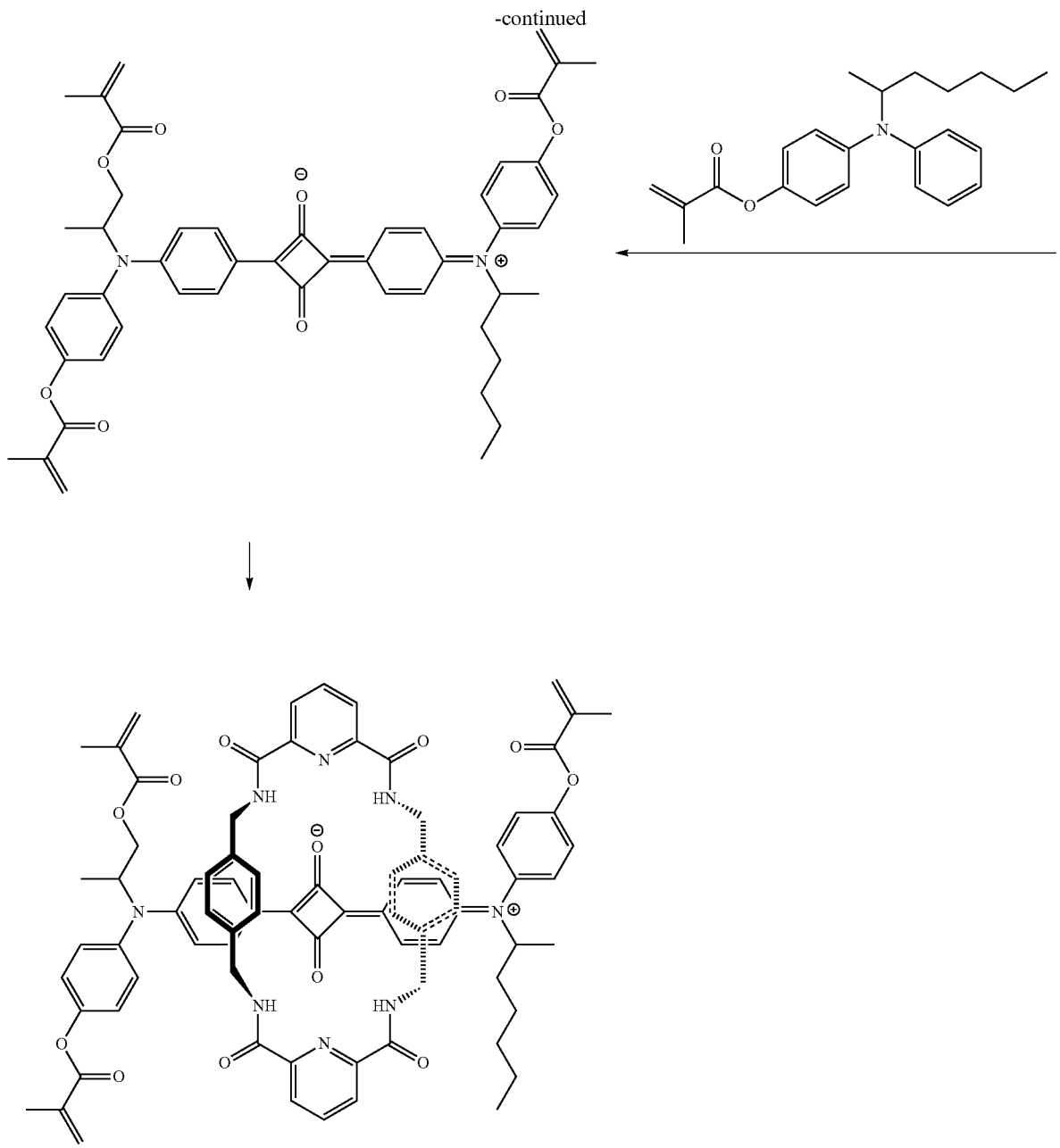

Synthesis of Compound 1

After adding thionyl chloride (0.025 mol) to squaric acid (0.01 mol), a small amount of DMF was added thereto and then, heated at 75° C. for 3 hours and after removing an excess of the thionyl chloride through distillation, the residue was stirred in a methacrylic intermediate and a toluene solvent at 80° C. for 16 hours. The resultant was extracted with ethyl acetate and washed with water. The extracted organic layer was distilled under a reduced pressure and purified through column chromatography, obtaining Compound 1.

Synthesis of Compound 2

Subsequently, acetic acid (8 fold), distilled water (8 fold), and hydrochloric acid (0.1 fold) were added to Intermediate 1 (0.01 mol) and then, stirred at 130° C. for 16 hours. The resultant was extracted with ethyl acetate and washed with water. The extracted organic layer was distilled under a reduced pressure and purified through column chromatography, obtaining Compound 2. (The "fold" means multiple of mass, thus the mass of the acetic acid is eight times of the mass of the intermediate 1. The weight-average molecular weight of the intermediate 1 is 243.3 g, thus the mass of the intermediate 1(0.01 mol) is 2.433 g. In this case, the mass of the acetic acid(8 fold) is 19.464 g(2.433 g×8).)

The other processes for the synthesis of a squarylium-based dye and the Encap method were performed according to the same method as Synthesis Example 1, synthesizing a compound represented by Chemical Formula 0.

[Chemical Formula O]

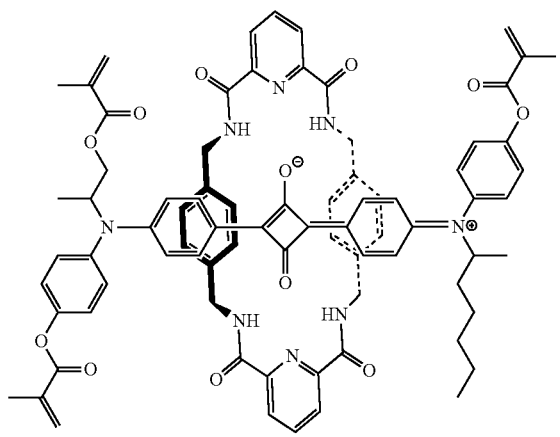

MALDI-TOF MS: 1342.57 m/z

Comparative Synthesis Example 1: Synthesis of Compound Represented by Chemical Formula C-1

(1-Methyl-hexyl)-phenyl-p-tolyl-amine (100 mmol) and 3,4-Dihydroxy-cyclobut-3-ene-1,2-dione (50 mmol) were added to toluene (300 mL) and butanol (300 mL) and then, refluxed, and water produced therefrom was distilled off with a Dean-stark distillation apparatus. The reactant was stirred for 12 hours, distilled off under a reduced pressure, and purified through column chromatography, obtaining a squarylium compound. This squarylium compound (5 mmol) was dissolved in 600 mL of a chloroform solvent, and a solution prepared by dissolving pyridine-2,6-dicarbonyl dichloride (20 mmol) and p-xylylene diamine (20 mmol) in 60 mL of chloroform was added dropwise thereto at ambient temperature for 5 hours. After 12 hours, the obtained mixture was distilled under a reduced pressure and then, separated through column chromatography, obtaining a compound represented by Chemical Formula C-1.

[Chemical Formula C-1]

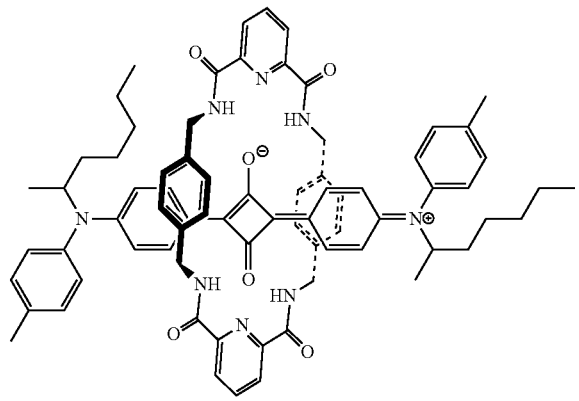

MALDI-TOF MS: 1175.5 m/z

Comparative Synthesis Example 2: Synthesis of Compound Represented by Chemical Formula C-2

Propionic acid 2-{(2-cyanoethyl)-[4-(2-hydroxy-3,4-dioxocyclobut-1-enyl)-phenyl]-amino}-ethyl ester (60 mmol), 1-(2-ethylhexyl)-1H-indole (60 mmol) were added to toluene (200 mL) and butanol (200 mL) and then, refluxed, and water produced therein was removed with a Dean-stark distillation apparatus. A green reactant therefrom was stirred for 12 hours, distilled under a reduced pressure, and purified through column chromatography, obtaining an asymmetric squarylium compound. This squarylium compound (5 mmol) was dissolved in 600 mL of a chloroform solvent, and then, pyridine-2,6-dicarbonyl dichloride (20 mmol) and p-xylylene diamine (20 mmol) were dissolved in 60 mL of chloroform and simultaneously added dropwise thereto at ambient temperature for 5 hours. After 12 hours, the obtained mixture was distilled under a reduced pressure and separated through column chromatography, obtaining a compound represented by Chemical Formula C-2.

[Chemical Formula C-2]

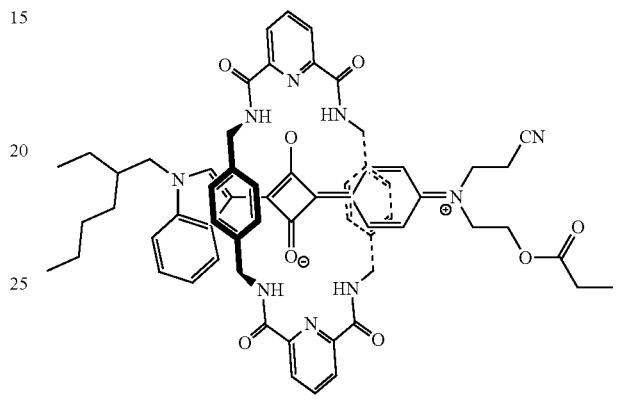

MALDI-TOF MS: 1088.48 m/z

Comparative Synthesis Example 3: Synthesis of Compound Represented by Chemical Formula C-3

Synthesis of Starting Material

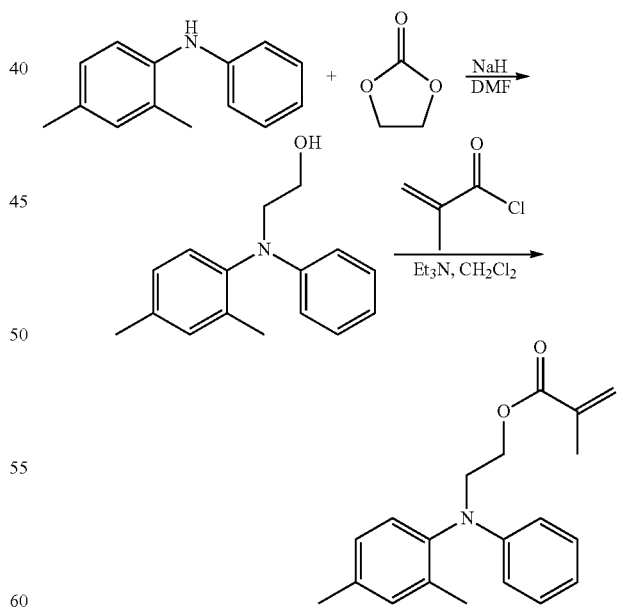

2,4-dimethyldiphenylamine (0.1 mol), NaH (0.2 mol), and ethylene carbonate (0.2 mol) were heated in a DMF solvent at 140° C. for 16 hours. The resultant was extracted with ethyl acetate and washed with water. The extracted organic layer was distilled under a reduced pressure and purified through column chromatography, synthesizing an intermediate. Other than this, methacryl was synthesized using a suitable method. In addition, the same squarylium dye and Encap methods as Synthesis Example 1 were used, obtaining a compound represented by Chemical Formula C-3.

[Chemical Formula C-3]

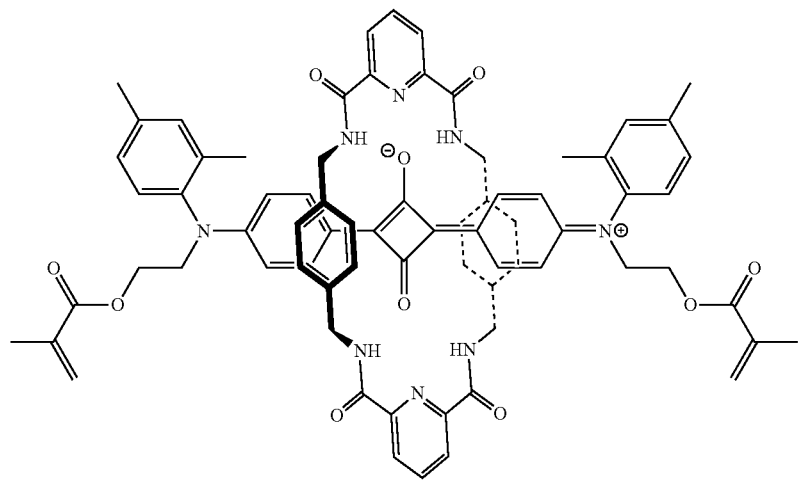

MALDI-TOF MS: 1230.52 m/z

Synthesis of Photosensitive Resin Composition

Example 1

The following components were mixed in each composition as shown in Table 1 to prepare a photosensitive resin composition according to Example 1.

Specifically, a photopolymerization initiator was dissolved in a solvent, the solution was stirred at ambient temperature for 2 hours, a binder resin and a photopolymerizable monomer were added thereto, and the obtained mixture was stirred at ambient temperature for 2 hours. Subsequently, the compound (represented by Chemical Formula A) according to Synthesis Example 1 as a colorant was added thereto and then, stirred for 1 hour at ambient temperature. Then, the product was filtered three times to remove impurities and prepare a photosensitive resin composition.

TABLE 1

(unit: wt %)

| | Raw materials | Amount |
|---|---|---|
| Colorant Dye | Compound of Synthesis Example 1 (Compound represented by Chemical Formula A) | 23 |
| Binder resin | (A)/(B) = 15/85 (w/w), molecular weight (Mw) = 22,000 g/mol (A): methacrylic acid (B): benzyl methacrylate | 3.5 |
| Photopolymerizable monomer | Dipentaerythritol hexacrylate (DPHA) | 8.0 |
| Photopolymerization initiator | 1,2-octandione | 1.0 |
| | 2-dimethylamino-2-(4-methyl-benzyl)-1-(4-morpholin-4-yl-phenyl)-butan-1-one | 0.5 |
| Solvent | Cyclohexanone | 34.0 |
| | PGMEA (propylene glycol monomethyl ether acetate) | 30.0 |
| | Total | 100.00 |

Example 2

A photosensitive resin composition was prepared according to the same method as Example 1 except that the compound (represented by Chemical Formula B) according to Synthesis Example 2 was used instead of the compound (represented by Chemical Formula A) according to Synthesis Example 1.

Example 3

A photosensitive resin composition was prepared according to the same method as Example 1 except that the compound (represented by Chemical Formula C) according to Synthesis Example 3 was used instead of the compound (represented by Chemical Formula A) according to Synthesis Example 1.

Example 4

A photosensitive resin composition was prepared according to the same method as Example 1 except that the compound (represented by Chemical Formula D) according to Synthesis Example 4 was used instead of the compound (represented by Chemical Formula A) according to Synthesis Example 1.

Example 5

A photosensitive resin composition was prepared according to the same method as Example 1 except that the compound (represented by Chemical Formula E) according to Synthesis Example 5 was used instead of the compound (represented by Chemical Formula A) according to Synthesis Example 1.

Example 6

A photosensitive resin composition was prepared according to the same method as Example 1 except that the compound (represented by Chemical Formula F) according to Synthesis Example 6 was used instead of the compound (represented by Chemical Formula A) according to Synthesis Example 1.

Example 7

A photosensitive resin composition was prepared according to the same method as Example 1 except that the compound (represented by Chemical Formula G) according to Synthesis Example 7 was used instead of the compound (represented by Chemical Formula A) according to Synthesis Example 1.

Example 8

A photosensitive resin composition was prepared according to the same method as Example 1 except that the compound (represented by Chemical Formula H) according to Synthesis Example 8 was used instead of the compound (represented by Chemical Formula A) according to Synthesis Example 1.

Example 9

A photosensitive resin composition was prepared according to the same method as Example 1 except that the compound (represented by Chemical Formula I) according to Synthesis Example 9 was used instead of the compound (represented by Chemical Formula A) according to Synthesis Example 1.

Example 10

A photosensitive resin composition was prepared according to the same method as Example 1 except that the compound (represented by Chemical Formula K) according to Synthesis Example 10 was used instead of the compound (represented by Chemical Formula A) according to Synthesis Example 1.

Example 11

A photosensitive resin composition was prepared according to the same method as Example 1 except that the compound (represented by Chemical Formula M) according to Synthesis Example 11 was used instead of the compound (represented by Chemical Formula A) according to Synthesis Example 1.

Example 12

A photosensitive resin composition was prepared according to the same method as Example 1 except that the compound (represented by Chemical Formula 0) according to Synthesis Example 12 was used instead of the compound (represented by Chemical Formula A) according to Synthesis Example 1.

Comparative Example 1

A photosensitive resin composition was prepared according to the same method as Example 1 except that the compound (represented by Chemical Formula C-1) according to Comparative Synthesis Example 1 was used instead of the compound (represented by Chemical Formula A) according to Synthesis Example 1.

Comparative Example 2

A photosensitive resin composition was prepared according to the same method as Example 1 except that the compound (represented by Chemical Formula C-2) according to Comparative Synthesis Example 2 was used instead of the compound (represented by Chemical Formula A) according to Synthesis Example 1.

Comparative Example 3

A photosensitive resin composition was prepared according to the same method as Example 1 except that the compound (represented by Chemical Formula C-3) according to Comparative Synthesis Example 3 was used instead of the compound (represented by Chemical Formula A) according to Synthesis Example 1.

Evaluation: Measurement of Chemical Resistance of Composition

Each color filter specimen prepared by using the photosensitive resin compositions according to Examples 1 to 12 and Comparative Examples 1 to 3 was immersed in a PGMEA solution at ambient temperature for 10 minutes and then, evaluated with respect to chemical resistance with reference to an absorption intensity change rate at $\lambda$max before and after the solution immersion, and the results are shown in Table 2.

TABLE 2

| | Chemical Resistance (unit: %) |
|---|---|
| Example 1 | 2.9 |
| Example 2 | 3.1 |
| Example 3 | 2.3 |
| Example 4 | 2.8 |
| Example 5 | 3.3 |
| Example 6 | 3.6 |
| Example 7 | 2.9 |
| Example 8 | 2.7 |
| Example 9 | 2.2 |
| Example 10 | 2.4 |
| Example 11 | 0.3 |
| Example 12 | 4.0 |
| Comparative Example 1 | 90 |
| Comparative Example 2 | 82 |
| Comparative Example 3 | 25 |

Referring to Table 2, the photosensitive resin compositions of Examples 1 to 12 including the core-shell compound according to an embodiment exhibited excellent chemical resistance and were very suitable to be applied to a CMOS image sensor.

By way of summation and review, the CMOS image sensor has been developed along a technology trend of increasing the number of pixels and decreasing a size for realizing high-definition and down-sizing a device. As the pixels become smaller, there may be a limit to manufacture a fine pattern by using a pigment, and accordingly, a dye may be used to compensate for this. A dye may have issues in terms of processibility during the pattern manufacture, compared with a pigment. A dye may have issues in terms of chemical resistance, because the pigment is fine particles and has crystallinity and thus insufficient solubility and thereby may not be eluted in a solvent such as PGMEA after the baking, and the dye may be an amorphous solid and thus could be dissolved out in the solvent after the baking. The CMOS image sensor may use a high content of a colorant and thus a binder resin or a monomer at a relatively lower ratio, and it could be difficult to improve the chemical resistance of the dye.

The CCD and CMOS image sensors use the same light-receiving element, but in the CCD image sensor, charges generated in the light-receiving element sequentially move through MOS capacitors connected in series and are converted into voltages in a source follower connected at the final end. On the other hand, in the CMOS image sensor, the charges are converted into voltages in a source follower built into each pixel and output to the outside. The CCD image sensor moves electrons generated by light as they are to an output unit by using a gate pulse, but the CMOS image sensor convert the electrons generated by light into voltages in each pixel and then output them through several CMOS switches. These image sensors are very widely applied from household products such as a digital camera and a mobile phone to an endoscope used in hospitals and a telescope used in a satellite orbiting the earth.

One or more embodiments may provide a core-shell compound for a green pixel in a color filter for a CMOS image sensor.

The core-shell compound according to an embodiment may have excellent chemical resistance by itself, and thus may maintain improved chemical resistance even after curing and thermal processes, and thus the photosensitive resin composition including this as a dye may form a fine pattern, thereby providing a green color filter for a CMOS image sensor.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A core-shell compound, comprising:
a squarylium core represented by Chemical Formula 1; and
a shell surrounding the squarylium core,

[Chemical Formula 1]

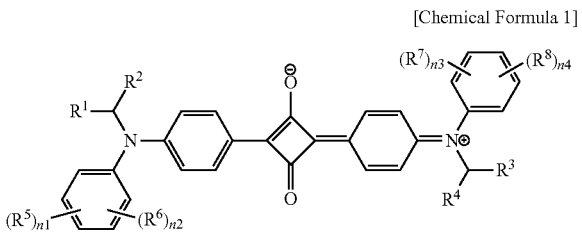

wherein, in Chemical Formula 1,
$R^1$ to $R^8$ are each independently a hydrogen atom, a (meth)acrylate group, a substituted or unsubstituted C1 to C20 alkyl group, or a substituted or unsubstituted C1 to C20 alkoxy group, provided that $R^1$ to $R^8$ are not all simultaneously a hydrogen atom, at least one of $R^1$, $R^2$, $R^5$, and $R^6$ includes a (meth)acrylate group at a terminal end thereof,
at least two of $R^3$, $R^4$, $R^7$, and $R^8$ include a (meth)acrylate group at a terminal end thereof, and
n1, n2, n3, and n4 are each independently an integer of 0 to 2, in which n1+n2≠0 and n3+n4≠0.

2. The core-shell compound as claimed in claim 1, wherein the squarylium core includes four or more (meth)acrylate groups.

3. The core-shell compound as claimed in claim 1, wherein:
at least one (meth)acrylate group is present as a substituent of an aryl group of the squarylium core, and
at least one other (meth)acrylate group is present as a substituent of an alkyl group or an alkoxy group of the squarylium core.

4. The core-shell compound as claimed in claim 1, wherein:
two of $R^1$, $R^2$, $R^5$, and $R^6$ each independently include a (meth)acrylate group at a terminal end thereof, and
two of $R^3$, $R^4$, $R^7$, and $R^8$ each independently include a (meth)acrylate group at a terminal end thereof.

5. The core-shell compound as claimed in claim 1, wherein:
three of $R^1$, $R^2$, $R^5$, and $R^6$ each independently include a (meth)acrylate group at a terminal end thereof, and
three of $R^3$, $R^4$, $R^7$, and $R^8$ each independently include a (meth)acrylate group at a terminal end thereof.

6. The core-shell compound as claimed in claim 4, wherein:
Chemical Formula 1 is represented by Chemical Formula 1-1:

[Chemical Formula 1-1]

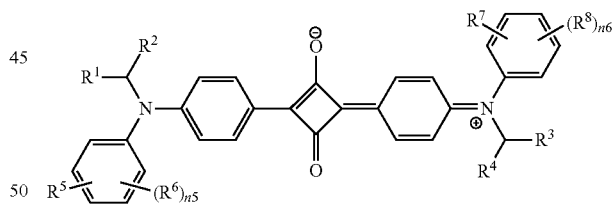

wherein, in Chemical Formula 1-1,
$R^2$, $R^4$, $R^6$, and $R^8$ each independently a hydrogen atom, a substituted or unsubstituted C1 to C20 alkyl group or a substituted or unsubstituted C1 to C20 alkoxy group, provided that $R^2$, $R^4$, $R^6$, and $R^8$ are not all simultaneously hydrogen atoms and do not contain a (meth)acrylate group,
$R^1$, $R^3$, $R^5$, and $R^7$ are each independently a substituted C1 to C20 alkyl group including a (meth)acrylate group at a terminal end or a substituted C1 to C20 alkoxy group including a (meth)acrylate group at a terminal end, and
n5 and n6 are each independently an integer of 0 to 2.

7. The core-shell compound as claimed in claim 4, wherein:

Chemical Formula 1 is represented by Chemical Formula 1-2:

[Chemical Formula 1-2]

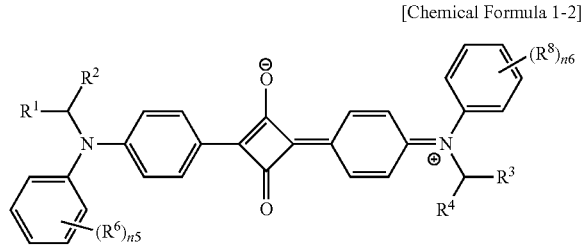

in Chemical Formula 1-2, $R^6$ and $R^8$ are each independently a hydrogen atom, a substituted or unsubstituted C1 to C20 alkyl group or a substituted or unsubstituted C1 to C20 alkoxy group, provided that $R^6$ and $R^8$ are not simultaneously hydrogen atoms and do not contain a (meth)acrylate group, $R^1$ to $R^4$ are each independently a substituted C1 to C20 alkyl group including a (meth)acrylate group at a terminal end or a substituted C1 to C20 alkoxy group including a (meth)acrylate group at a terminal end, and n5 and n6 are each independently an integer of 0 to 2.

8. The core-shell compound as claimed in claim 5, wherein:

Chemical Formula 1 is represented by Chemical Formula 1-3:

[Chemical Formula 1-3]

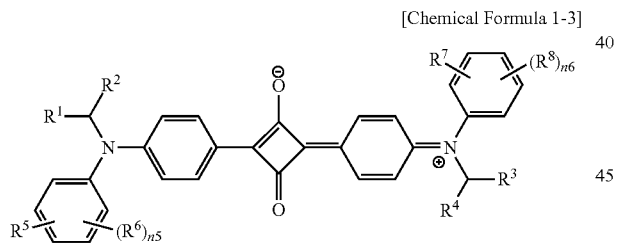

in Chemical Formula 1-3, $R^6$ and $R^8$ are each independently a hydrogen atom, a substituted or unsubstituted C1 to C20 alkyl group or a substituted or unsubstituted C1 to C20 alkoxy group, provided that $R^6$ and $R^8$ are not simultaneously hydrogen and do not contain a siloxane group, $R^1$ to $R^5$ and $R^7$ are each independently a substituted C1 to C20 alkyl group including a (meth)acrylate group at a terminal end or a substituted C1 to C20 alkoxy group including a (meth)acrylate group at a terminal end, and n5 and n6 are each independently an integer of 0 to 2.

9. The core-shell compound as claimed in claim 1, wherein the squarylium core represented by Chemical Formula 1 has a maximum absorption wavelength at about 610 nm to about 640 nm.

10. The core-shell compound as claimed in claim 1, wherein:

the shell is represented by Chemical Formula 2:

[Chemical Formula 2]

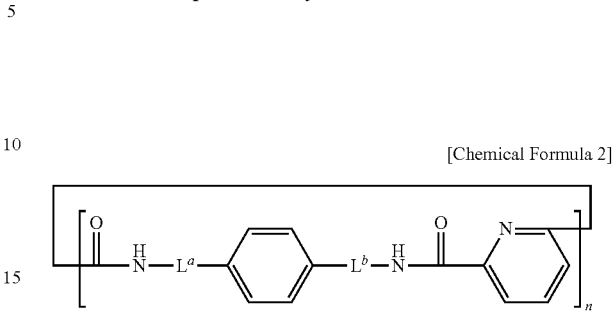

in Chemical Formula 2, $L^a$ and $L^b$ are each independently a single bond or a substituted or unsubstituted C1 to C10 alkylene group, and n is an integer greater than or equal to 2.

11. The core-shell compound as claimed in claim 10, wherein the shell represented by Chemical Formula 2 is represented by Chemical Formula 2-1:

[Chemical Formula 2-1]

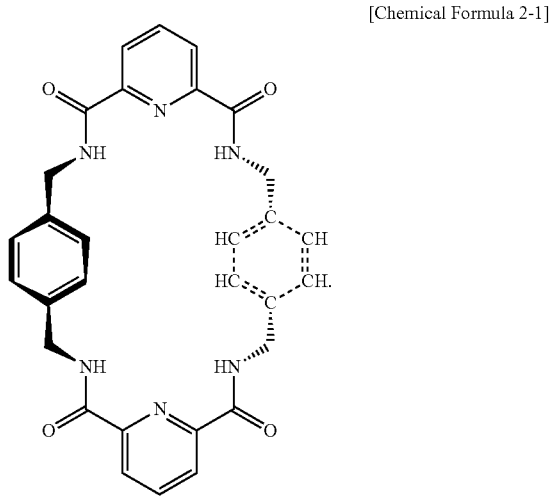

12. The core-shell compound as claimed in claim 1, wherein:

the core-shell compound is represented by one of Chemical Formula A to Chemical Formula N:

[Chemical Formula A]
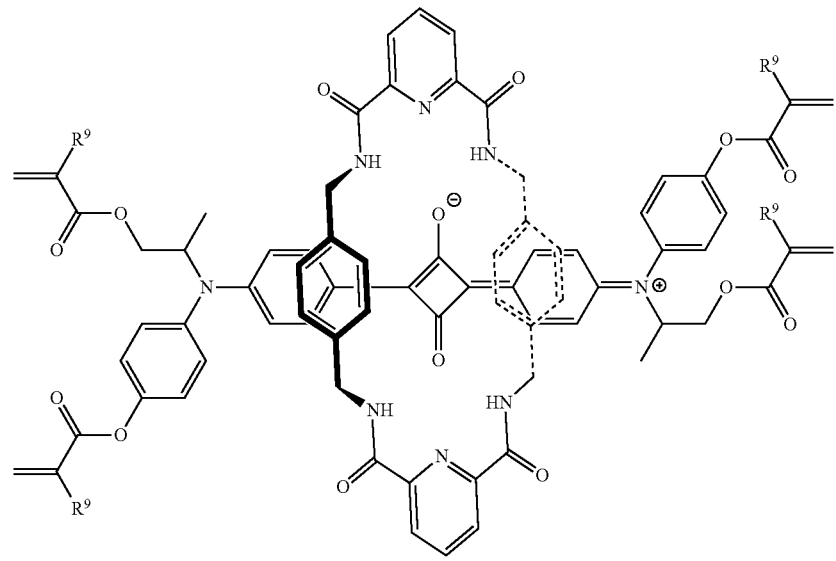
[Chemical Formula B]
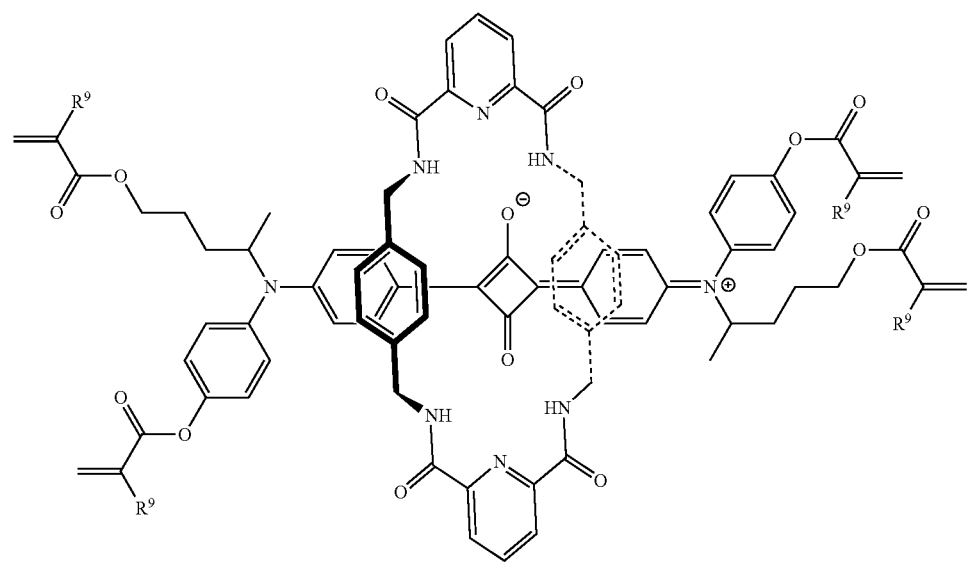

-continued
[Chemical Formula C]
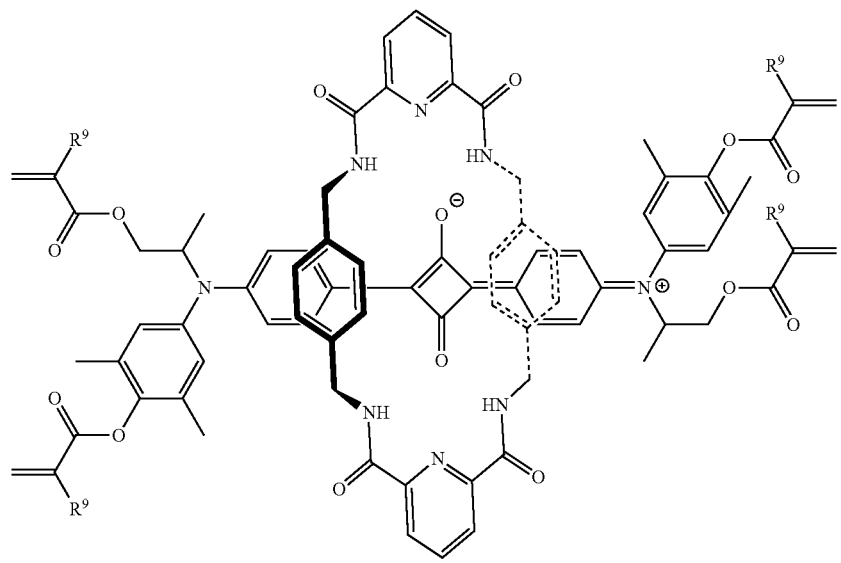
[Chemical Formula D]
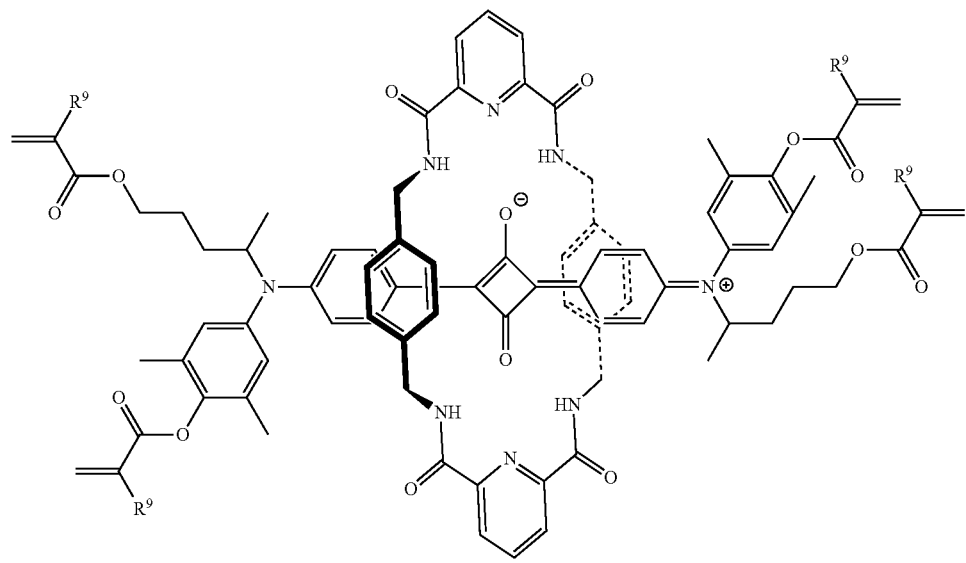

[Chemical Formula E]
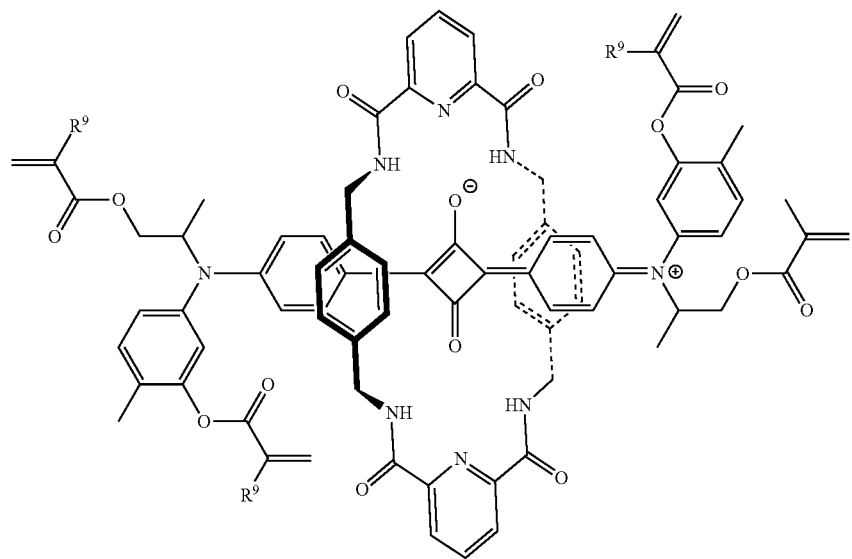
[Chemical Formula F]
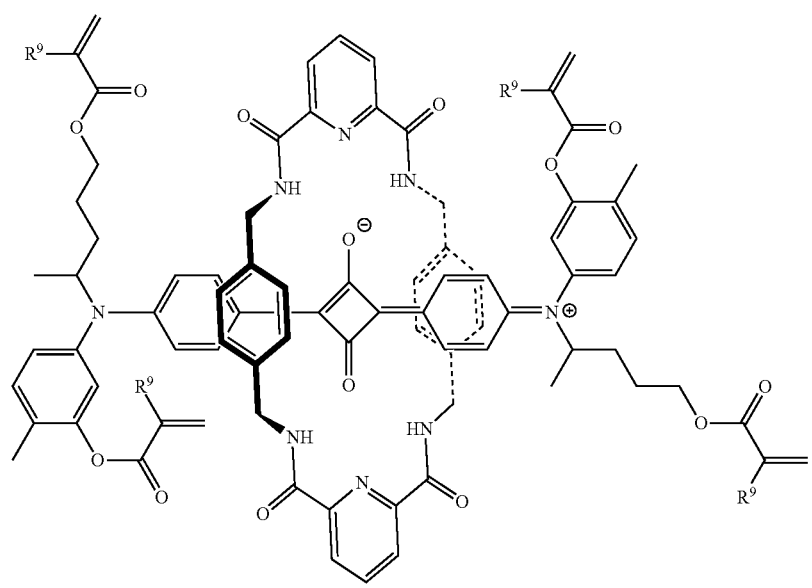

[Chemical Formula G]
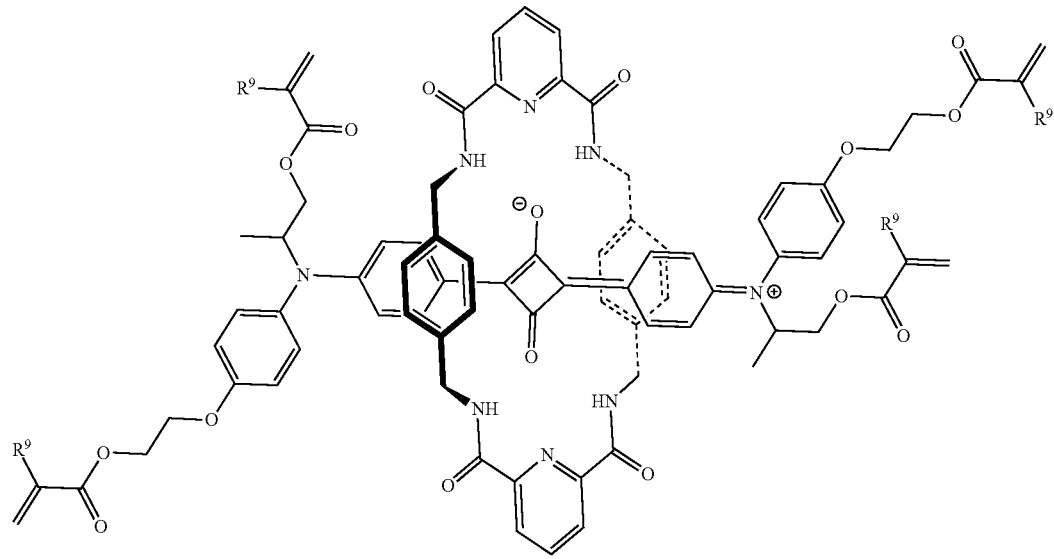
[Chemical Formula H]
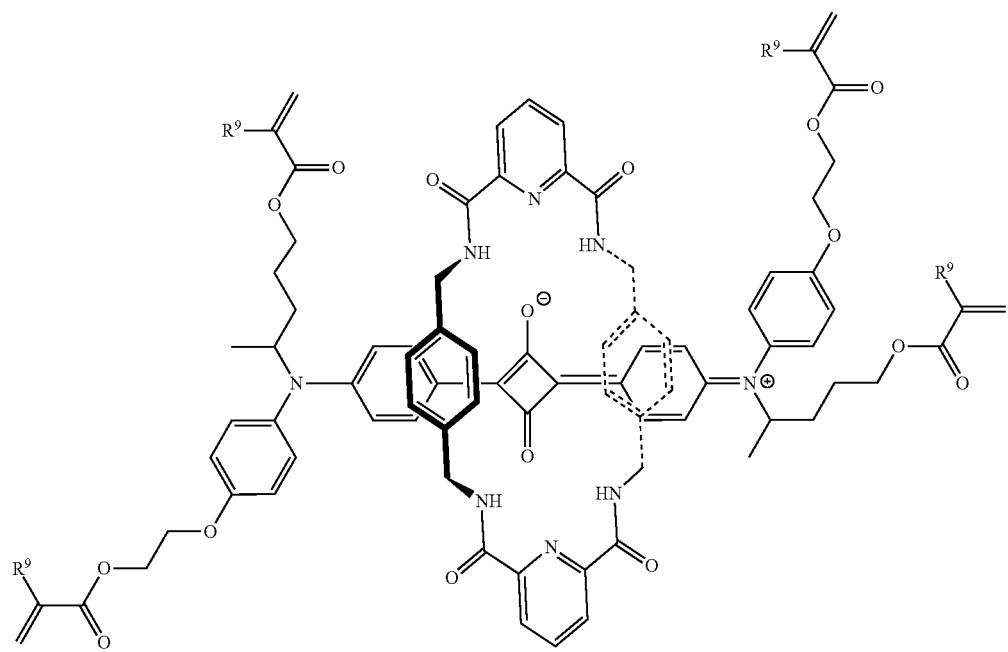

[Chemical Formula I]
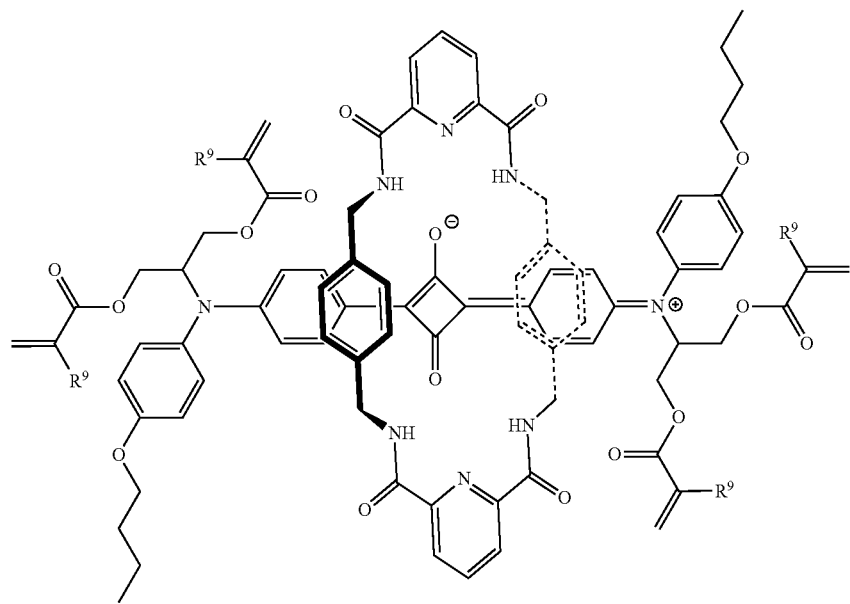
[Chemical Formula J]
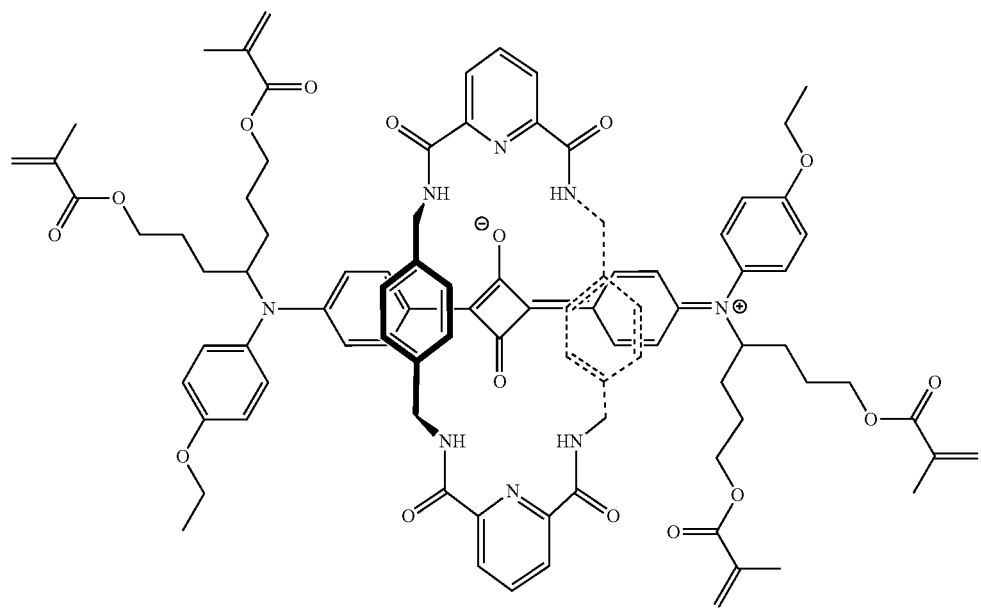

[Chemical Formula K]
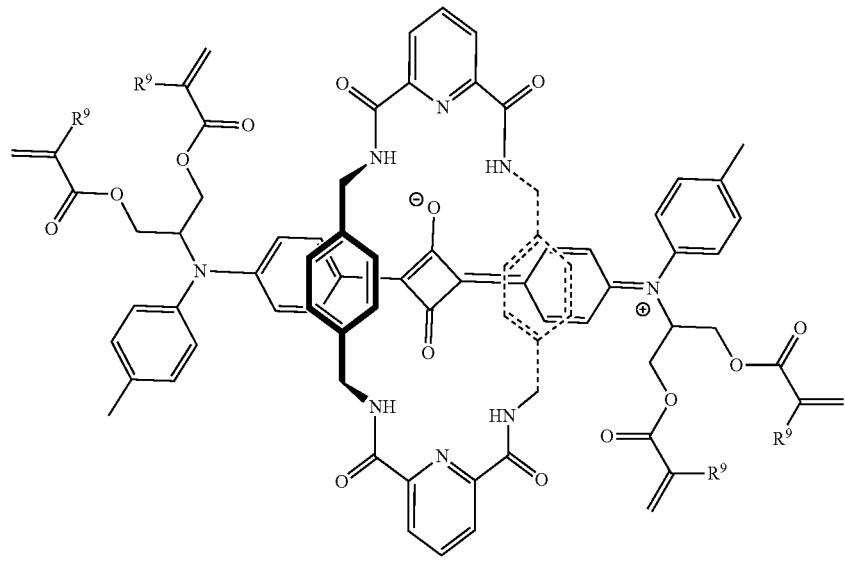
[Chemical Formula L]
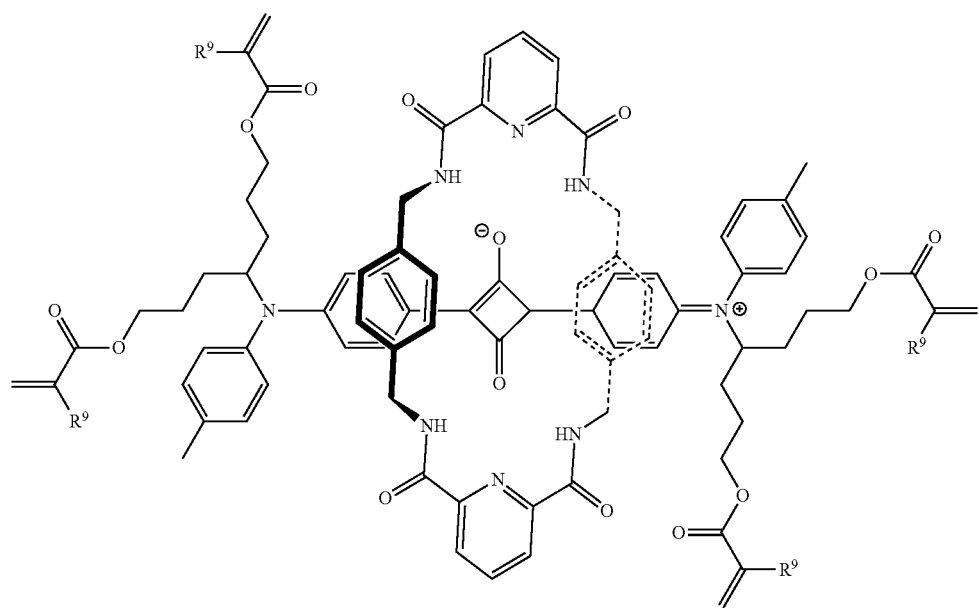

-continued

[Chemical Formula M]

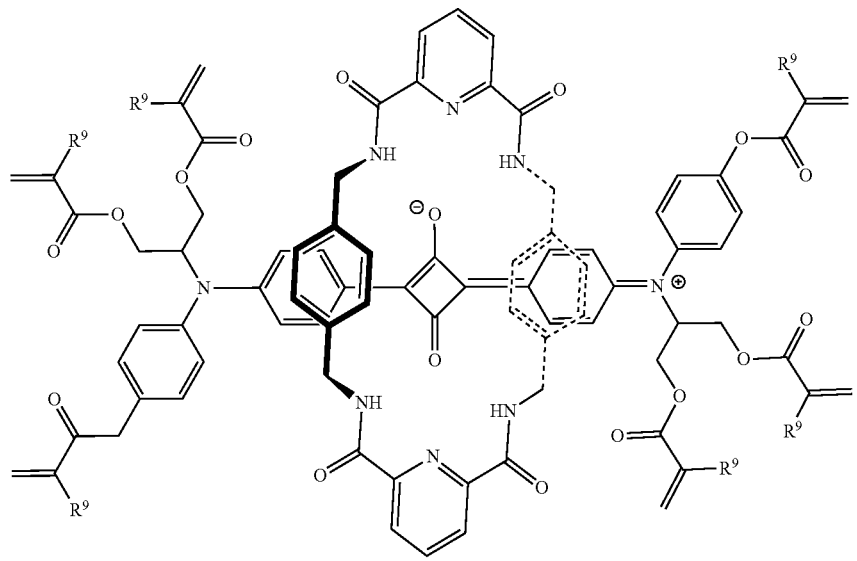

[Chemical Formula N]

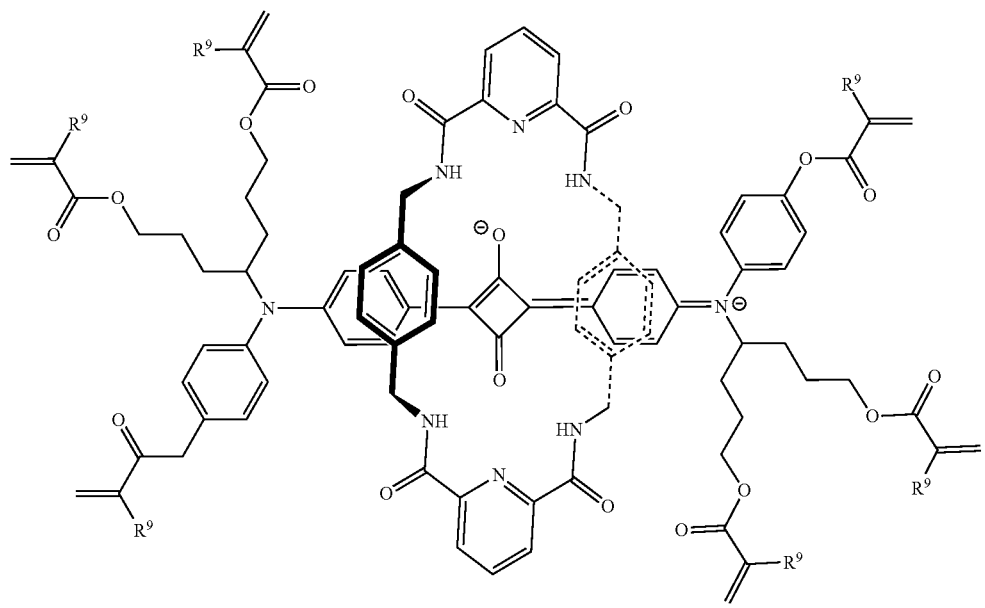

in Chemical Formula A to Chemical Formula N, $R^9$ is a hydrogen atom or a substituted or unsubstituted C1 to C10 alkyl group.

13. The core-shell compound as claimed in claim 1, wherein the core-shell compound is a green dye.

14. A photosensitive resin composition comprising the core-shell compound as claimed in claim 1.

15. The photosensitive resin composition as claimed in claim 14, wherein the core-shell compound is included in an amount of about 15 wt % to about 30 wt %, based on a total weight of the photosensitive resin composition.

16. The photosensitive resin composition as claimed in claim 14, further comprising a binder resin, a photopolymerizable monomer, a photopolymerization initiator, and a solvent.

17. The photosensitive resin composition as claimed in claim 14, wherein the photosensitive resin composition is used for a CMOS image sensor.

18. A photosensitive resin layer manufactured by using the photosensitive resin composition as claimed in claim 14.

19. A color filter comprising the photosensitive resin layer as claimed in claim 18.

20. A CMOS image sensor comprising the color filter as claimed in claim 19.

\* \* \* \* \*